(12) United States Patent
Yang et al.

(10) Patent No.: US 11,967,483 B2
(45) Date of Patent: *Apr. 23, 2024

(54) PLASMA EXCITATION WITH ION ENERGY CONTROL

(71) Applicant: Applied Materials, Inc., Santa Clara, CA (US)

(72) Inventors: Yang Yang, San Diego, CA (US); Yue Guo, Redwood City, CA (US); Kartik Ramaswamy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 437 days.

This patent is subject to a terminal disclaimer.

(21) Appl. No.: 17/337,146

(22) Filed: Jun. 2, 2021

(65) Prior Publication Data

US 2022/0392750 A1  Dec. 8, 2022

(51) Int. Cl.
*H01J 37/32* (2006.01)
*H03H 7/01* (2006.01)

(52) U.S. Cl.
CPC ..... *H01J 37/32146* (2013.01); *H03H 7/0115* (2013.01); *H01J 2237/327* (2013.01)

(58) Field of Classification Search
CPC .......... H01J 37/32146; H01J 2237/327; H03H 7/0115
See application file for complete search history.

(56) References Cited

U.S. PATENT DOCUMENTS

| | | |
|---|---|---|
| 4,070,589 A | 1/1978 | Martinkovic |
| 4,340,462 A | 7/1982 | Koch |
| 4,464,223 A | 8/1984 | Gorin |
| 4,504,895 A | 3/1985 | Steigerwald |
| 4,585,516 A | 4/1986 | Corn et al. |
| 4,683,529 A | 7/1987 | Bucher, II |
| 4,931,135 A | 6/1990 | Horiuchi et al. |
| 4,992,919 A | 2/1991 | Lee et al. |
| 5,099,697 A | 3/1992 | Agar |
| 5,140,510 A | 8/1992 | Myers |
| 5,242,561 A | 9/1993 | Sato |
| 5,449,410 A | 9/1995 | Chang et al. |
| 5,451,846 A | 9/1995 | Peterson et al. |
| 5,464,499 A | 11/1995 | Moslehi et al. |
| 5,554,959 A | 9/1996 | Tang |
| 5,565,036 A | 10/1996 | Westendorp et al. |
| 5,595,627 A | 1/1997 | Inazawa et al. |
| 5,597,438 A | 1/1997 | Grewal et al. |
| 5,610,452 A | 3/1997 | Shimer et al. |
| 5,698,062 A | 12/1997 | Sakamoto et al. |
| 5,716,534 A | 2/1998 | Tsuchiya et al. |
| 5,770,023 A | 6/1998 | Sellers |
| 5,796,598 A | 8/1998 | Nowak et al. |
| 5,810,982 A | 9/1998 | Sellers |
| 5,830,330 A | 11/1998 | Lantsman |
| 5,882,424 A | 3/1999 | Taylor et al. |
| 5,928,963 A | 7/1999 | Koshiishi |
| 5,933,314 A | 8/1999 | Lambson et al. |
| 5,935,373 A | 8/1999 | Koshimizu |
| 5,948,704 A | 9/1999 | Benjamin et al. |
| 5,997,687 A | 12/1999 | Koshimizu |
| 6,043,607 A | 3/2000 | Roderick |
| 6,051,114 A | 4/2000 | Yao et al. |
| 6,055,150 A | 4/2000 | Clinton et al. |
| 6,074,518 A | 6/2000 | Imafuku et al. |
| 6,089,181 A | 7/2000 | Suemasa et al. |
| 6,099,697 A | 8/2000 | Hausmann |
| 6,110,287 A | 8/2000 | Arai et al. |
| 6,117,279 A | 9/2000 | Smolanoff et al. |
| 6,125,025 A | 9/2000 | Howald et al. |
| 6,133,557 A | 10/2000 | Kawanabe et al. |
| 6,136,387 A | 10/2000 | Koizumi |
| 6,187,685 B1 | 2/2001 | Hopkins et al. |
| 6,197,151 B1 | 3/2001 | Kaji et al. |
| 6,198,616 B1 | 3/2001 | Dahimene et al. |
| 6,201,208 B1 | 3/2001 | Wendt et al. |
| 6,214,162 B1 | 4/2001 | Koshimizu |
| 6,232,236 B1 | 5/2001 | Shan et al. |
| 6,252,354 B1 | 6/2001 | Collins et al. |
| 6,253,704 B1 | 7/2001 | Savas |

(Continued)

FOREIGN PATENT DOCUMENTS

| | | |
|---|---|---|
| CN | 101990353 A | 3/2011 |
| CN | 102084024 A | 6/2011 |

(Continued)

OTHER PUBLICATIONS

U.S. Appl. No. 17/361,178, filed Jun. 28, 2021.
U.S. Appl. No. 63/210,956, filed Jun. 15, 2021.
U.S. Appl. No. 17/475,223, filed Sep. 14, 2021.
U.S. Appl. No. 17/537,314, filed Nov. 29, 2021.
Chinese Office Action for 201880053380.1 dated Dec. 2, 2021.
Taiwan Office Action for 108132682 dated Mar. 24, 2022.
Wang, S.B., et al.—"Control of ion energy distribution at substrates during plasma processing," Journal of Applied Physics, vol. 88, No. 2, Jul. 15, 2000, pp. 643-646.
PCT International Search Report and Written Opinion dated Nov. 9, 2018, for International Application No. PCT/US2018/043032.

(Continued)

*Primary Examiner* — Nicole M Ippolito
(74) *Attorney, Agent, or Firm* — Patterson + Sheridan, LLP

(57) ABSTRACT

Embodiments provided herein generally include apparatus, plasma processing systems and methods for generation of a waveform for plasma processing of a substrate in a processing chamber. One embodiment includes a waveform generator having a voltage source selectively coupled to an output node, where the output node is configured to be coupled to an electrode disposed within a processing chamber, and where the output node is selectively coupled to a ground node. The waveform generator may also include a radio frequency (RF) signal generator, and a first filter coupled between the RF signal generator and the output node.

26 Claims, 5 Drawing Sheets

(56) References Cited

U.S. PATENT DOCUMENTS

| | | |
|---|---|---|
| 6,277,506 B1 | 8/2001 | Okamoto |
| 6,309,978 B1 | 10/2001 | Donohoe et al. |
| 6,313,583 B1 | 11/2001 | Arita et al. |
| 6,355,992 B1 | 3/2002 | Via |
| 6,358,573 B1 | 3/2002 | Raoux et al. |
| 6,367,413 B1 | 4/2002 | Sill et al. |
| 6,392,187 B1 | 5/2002 | Johnson |
| 6,395,641 B2 | 5/2002 | Savas |
| 6,413,358 B2 | 7/2002 | Donohoe |
| 6,423,192 B1 | 7/2002 | Wada et al. |
| 6,433,297 B1 | 8/2002 | Kojima et al. |
| 6,435,131 B1 | 8/2002 | Koizumi |
| 6,451,389 B1 | 9/2002 | Amann et al. |
| 6,456,010 B2 | 9/2002 | Yamakoshi et al. |
| 6,483,731 B1 | 11/2002 | Isurin et al. |
| 6,535,785 B2 | 3/2003 | Johnson et al. |
| 6,621,674 B2 | 9/2003 | Zahringer et al. |
| 6,664,739 B1 | 12/2003 | Kishinevsky et al. |
| 6,733,624 B2 | 5/2004 | Koshiishi et al. |
| 6,740,842 B2 | 5/2004 | Johnson et al. |
| 6,741,446 B2 | 5/2004 | Ennis |
| 6,777,037 B2 | 8/2004 | Sumiya et al. |
| 6,808,607 B2 | 10/2004 | Christie |
| 6,818,103 B1 | 11/2004 | Scholl et al. |
| 6,818,257 B2 | 11/2004 | Amann et al. |
| 6,830,595 B2 | 12/2004 | Reynolds, III |
| 6,830,650 B2 | 12/2004 | Roche et al. |
| 6,849,154 B2 | 2/2005 | Nagahata et al. |
| 6,861,373 B2 | 3/2005 | Aoki et al. |
| 6,863,020 B2 | 3/2005 | Mitrovic et al. |
| 6,896,775 B2 | 5/2005 | Chistyakov |
| 6,902,646 B2 | 6/2005 | Mahoney et al. |
| 6,917,204 B2 | 7/2005 | Mitrovic et al. |
| 6,947,300 B2 | 9/2005 | Pai et al. |
| 6,962,664 B2 | 11/2005 | Mitrovic |
| 6,970,042 B2 | 11/2005 | Glueck |
| 6,972,524 B1 | 12/2005 | Marakhtanov et al. |
| 7,016,620 B2 | 3/2006 | Maess et al. |
| 7,046,088 B2 | 5/2006 | Ziegler |
| 7,059,267 B2 | 6/2006 | Hedberg et al. |
| 7,104,217 B2 | 9/2006 | Himori et al. |
| 7,115,185 B1 | 10/2006 | Gonzalez et al. |
| 7,126,808 B2 | 10/2006 | Koo et al. |
| 7,147,759 B2 | 12/2006 | Chistyakov |
| 7,151,242 B2 | 12/2006 | Schuler |
| 7,166,233 B2 | 1/2007 | Johnson et al. |
| 7,183,177 B2 | 2/2007 | Al-Bayati et al. |
| 7,206,189 B2 | 4/2007 | Reynolds, III |
| 7,218,503 B2 | 5/2007 | Howald |
| 7,218,872 B2 | 5/2007 | Shimomura |
| 7,226,868 B2 | 6/2007 | Mosden et al. |
| 7,265,963 B2 | 9/2007 | Hirose |
| 7,274,266 B2 | 9/2007 | Kirchmeier |
| 7,305,311 B2 | 12/2007 | van Zyl |
| 7,312,974 B2 | 12/2007 | Kuchimachi |
| 7,408,329 B2 | 8/2008 | Wiedemuth et al. |
| 7,415,940 B2 | 8/2008 | Koshimizu et al. |
| 7,440,301 B2 | 10/2008 | Kirchmeier et al. |
| 7,452,443 B2 | 11/2008 | Gluck et al. |
| 7,479,712 B2 | 1/2009 | Richert |
| 7,509,105 B2 | 3/2009 | Ziegler |
| 7,512,387 B2 | 3/2009 | Glueck |
| 7,535,688 B2 | 5/2009 | Yokouchi et al. |
| 7,586,099 B2 | 9/2009 | Eyhorn et al. |
| 7,586,210 B2 | 9/2009 | Wiedemuth et al. |
| 7,588,667 B2 | 9/2009 | Cerio, Jr. |
| 7,601,246 B2 | 10/2009 | Kim et al. |
| 7,609,740 B2 | 10/2009 | Glueck |
| 7,618,686 B2 | 11/2009 | Colpo et al. |
| 7,633,319 B2 | 12/2009 | Arai |
| 7,645,341 B2 | 1/2010 | Kennedy et al. |
| 7,651,586 B2 | 1/2010 | Moriya et al. |
| 7,652,901 B2 | 1/2010 | Kirchmeier et al. |
| 7,692,936 B2 | 4/2010 | Richter |
| 7,700,474 B2 | 4/2010 | Cerio, Jr. |
| 7,705,676 B2 | 4/2010 | Kirchmeier et al. |
| 7,706,907 B2 | 4/2010 | Hiroki |
| 7,718,538 B2 | 5/2010 | Kim et al. |
| 7,740,704 B2 | 6/2010 | Strang |
| 7,758,764 B2 | 7/2010 | Dhindsa et al. |
| 7,761,247 B2 | 7/2010 | van Zyl |
| 7,782,100 B2 | 8/2010 | Steuber et al. |
| 7,791,912 B2 | 9/2010 | Walde |
| 7,795,817 B2 | 9/2010 | Nitschke |
| 7,808,184 B2 | 10/2010 | Chistyakov |
| 7,821,767 B2 | 10/2010 | Fujii |
| 7,825,719 B2 | 11/2010 | Roberg et al. |
| 7,858,533 B2 | 12/2010 | Liu et al. |
| 7,888,240 B2 | 2/2011 | Hamamjy et al. |
| 7,898,238 B2 | 3/2011 | Wiedemuth et al. |
| 7,929,261 B2 | 4/2011 | Wiedemuth |
| RE42,362 E | 5/2011 | Schuler |
| 7,977,256 B2 | 7/2011 | Liu et al. |
| 7,988,816 B2 | 8/2011 | Koshiishi et al. |
| 7,995,313 B2 | 8/2011 | Nitschke |
| 8,044,595 B2 | 10/2011 | Nitschke |
| 8,052,798 B2 | 11/2011 | Moriya et al. |
| 8,055,203 B2 | 11/2011 | Choueiry et al. |
| 8,083,961 B2 | 12/2011 | Chen et al. |
| 8,110,992 B2 | 2/2012 | Nitschke |
| 8,128,831 B2 | 3/2012 | Sato et al. |
| 8,129,653 B2 | 3/2012 | Kirchmeier et al. |
| 8,133,347 B2 | 3/2012 | Gluck et al. |
| 8,133,359 B2 | 3/2012 | Nauman et al. |
| 8,140,292 B2 | 3/2012 | Wendt |
| 8,217,299 B2 | 7/2012 | Ilic et al. |
| 8,221,582 B2 | 7/2012 | Patrick et al. |
| 8,236,109 B2 | 8/2012 | Moriya et al. |
| 8,284,580 B2 | 10/2012 | Wilson |
| 8,313,612 B2 | 11/2012 | McMillin et al. |
| 8,313,664 B2 | 11/2012 | Chen et al. |
| 8,333,114 B2 | 12/2012 | Hayashi |
| 8,361,906 B2 | 1/2013 | Lee et al. |
| 8,382,999 B2 | 2/2013 | Agarwal et al. |
| 8,383,001 B2 | 2/2013 | Mochiki et al. |
| 8,384,403 B2 | 2/2013 | Zollner et al. |
| 8,391,025 B2 | 3/2013 | Walde et al. |
| 8,399,366 B1 | 3/2013 | Takaba |
| 8,419,959 B2 | 4/2013 | Bettencourt et al. |
| 8,422,193 B2 | 4/2013 | Tao et al. |
| 8,441,772 B2 | 5/2013 | Yoshikawa et al. |
| 8,456,220 B2 | 6/2013 | Thome et al. |
| 8,460,567 B2 | 6/2013 | Chen |
| 8,466,622 B2 | 6/2013 | Knaus |
| 8,542,076 B2 | 9/2013 | Maier |
| 8,551,289 B2 | 10/2013 | Nishimura et al. |
| 8,568,606 B2 | 10/2013 | Ohse et al. |
| 8,603,293 B2 | 12/2013 | Koshiishi et al. |
| 8,632,537 B2 | 1/2014 | McNall et al. |
| 8,641,916 B2 | 2/2014 | Yatsuda et al. |
| 8,685,267 B2 | 4/2014 | Yatsuda et al. |
| 8,704,607 B2 | 4/2014 | Yuzurihara et al. |
| 8,716,114 B2 | 5/2014 | Ohmi et al. |
| 8,716,984 B2 | 5/2014 | Mueller et al. |
| 8,735,291 B2 | 5/2014 | Ranjan et al. |
| 8,796,933 B2 | 8/2014 | Hermanns |
| 8,809,199 B2 | 8/2014 | Nishizuka |
| 8,821,684 B2 | 9/2014 | Ui et al. |
| 8,828,883 B2 | 9/2014 | Rueger |
| 8,845,810 B2 | 9/2014 | Hwang |
| 8,852,347 B2 | 10/2014 | Lee et al. |
| 8,884,523 B2 | 11/2014 | Winterhalter et al. |
| 8,884,525 B2 | 11/2014 | Hoffman et al. |
| 8,889,534 B1 | 11/2014 | Ventzek et al. |
| 8,895,942 B2 | 11/2014 | Liu et al. |
| 8,907,259 B2 | 12/2014 | Kasai et al. |
| 8,916,056 B2 | 12/2014 | Koo et al. |
| 8,926,850 B2 | 1/2015 | Singh et al. |
| 8,963,377 B2 | 2/2015 | Ziemba et al. |
| 8,979,842 B2 | 3/2015 | McNall, III et al. |
| 8,993,943 B2 | 3/2015 | Pohl et al. |
| 9,011,636 B2 | 4/2015 | Ashida |
| 9,039,871 B2 | 5/2015 | Nauman et al. |
| 9,042,121 B2 | 5/2015 | Walde et al. |

(56) References Cited

U.S. PATENT DOCUMENTS

| | | |
|---|---|---|
| 9,053,908 B2 | 6/2015 | Sriraman et al. |
| 9,059,178 B2 | 6/2015 | Matsumoto et al. |
| 9,087,798 B2 | 7/2015 | Ohtake et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,123,762 B2 | 9/2015 | Lin et al. |
| 9,129,776 B2 | 9/2015 | Finley et al. |
| 9,139,910 B2 | 9/2015 | Lee et al. |
| 9,147,555 B2 | 9/2015 | Richter |
| 9,150,960 B2 | 10/2015 | Nauman et al. |
| 9,159,575 B2 | 10/2015 | Ranjan et al. |
| 9,208,992 B2 | 12/2015 | Brouk et al. |
| 9,209,032 B2 | 12/2015 | Zhao et al. |
| 9,209,034 B2 | 12/2015 | Kitamura et al. |
| 9,210,790 B2 | 12/2015 | Hoffman et al. |
| 9,224,579 B2 | 12/2015 | Finley et al. |
| 9,226,380 B2 | 12/2015 | Finley |
| 9,228,878 B2 | 1/2016 | Haw et al. |
| 9,254,168 B2 | 2/2016 | Palanker |
| 9,263,241 B2 | 2/2016 | Larson et al. |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,313,872 B2 | 4/2016 | Yamazawa et al. |
| 9,355,822 B2 | 5/2016 | Yamada et al. |
| 9,362,089 B2 | 6/2016 | Brouk et al. |
| 9,373,521 B2 | 6/2016 | Mochiki et al. |
| 9,384,992 B2 | 7/2016 | Narishige et al. |
| 9,396,960 B2 | 7/2016 | Ogawa et al. |
| 9,404,176 B2 | 8/2016 | Parkhe et al. |
| 9,412,613 B2 | 8/2016 | Manna et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,496,150 B2 | 11/2016 | Mochiki et al. |
| 9,503,006 B2 | 11/2016 | Pohl et al. |
| 9,520,269 B2 | 12/2016 | Finley et al. |
| 9,530,667 B2 | 12/2016 | Rastogi et al. |
| 9,536,713 B2 | 1/2017 | Van Zyl et al. |
| 9,544,987 B2 | 1/2017 | Mueller et al. |
| 9,558,917 B2 | 1/2017 | Finley et al. |
| 9,564,287 B2 | 2/2017 | Ohse et al. |
| 9,570,313 B2 | 2/2017 | Ranjan et al. |
| 9,576,810 B2 | 2/2017 | Deshmukh et al. |
| 9,576,816 B2 | 2/2017 | Rastogi et al. |
| 9,577,516 B1 | 2/2017 | Van Zyl |
| 9,583,357 B1 | 2/2017 | Long et al. |
| 9,593,421 B2 | 3/2017 | Baek et al. |
| 9,601,283 B2 | 3/2017 | Ziemba et al. |
| 9,601,319 B1 | 3/2017 | Bravo et al. |
| 9,607,843 B2 | 3/2017 | Rastogi et al. |
| 9,620,340 B2 | 4/2017 | Finley |
| 9,620,376 B2 | 4/2017 | Kamp et al. |
| 9,620,987 B2 | 4/2017 | Alexander et al. |
| 9,637,814 B2 | 5/2017 | Bugyi et al. |
| 9,644,221 B2 | 5/2017 | Kanamori et al. |
| 9,651,957 B1 | 5/2017 | Finley |
| 9,655,221 B2 | 5/2017 | Ziemba et al. |
| 9,663,858 B2 | 5/2017 | Nagami et al. |
| 9,666,446 B2 | 5/2017 | Tominaga et al. |
| 9,666,447 B2 | 5/2017 | Rastogi et al. |
| 9,673,027 B2 | 6/2017 | Yamamoto et al. |
| 9,673,059 B2 | 6/2017 | Raley et al. |
| 9,685,297 B2 | 6/2017 | Carter et al. |
| 9,706,630 B2 | 7/2017 | Miller et al. |
| 9,711,331 B2 | 7/2017 | Mueller et al. |
| 9,711,335 B2 | 7/2017 | Christie |
| 9,728,429 B2 | 8/2017 | Ricci et al. |
| 9,734,992 B2 | 8/2017 | Yamada et al. |
| 9,741,544 B2 | 8/2017 | Van Zyl |
| 9,754,768 B2 | 9/2017 | Yamada et al. |
| 9,761,419 B2 | 9/2017 | Nagami |
| 9,761,459 B2 | 9/2017 | Long et al. |
| 9,767,988 B2 | 9/2017 | Brouk et al. |
| 9,786,503 B2 | 10/2017 | Raley et al. |
| 9,799,494 B2 | 10/2017 | Chen et al. |
| 9,805,916 B2 | 10/2017 | Konno et al. |
| 9,805,965 B2 | 10/2017 | Sadjadi et al. |
| 9,812,305 B2 | 11/2017 | Pelleymounter |
| 9,831,064 B2 | 11/2017 | Konno et al. |
| 9,837,285 B2 | 12/2017 | Tomura et al. |
| 9,840,770 B2 | 12/2017 | Klimczak et al. |
| 9,852,889 B1 | 12/2017 | Kellogg et al. |
| 9,852,890 B2 | 12/2017 | Mueller et al. |
| 9,865,471 B2 | 1/2018 | Shimoda et al. |
| 9,865,893 B2 | 1/2018 | Esswein et al. |
| 9,870,898 B2 | 1/2018 | Urakawa et al. |
| 9,872,373 B1 | 1/2018 | Shimizu et al. |
| 9,881,820 B2 | 1/2018 | Wong et al. |
| 9,922,802 B2 | 3/2018 | Hirano et al. |
| 9,922,806 B2 | 3/2018 | Tomura et al. |
| 9,929,004 B2 | 3/2018 | Ziemba et al. |
| 9,941,097 B2 | 4/2018 | Yamazawa et al. |
| 9,941,098 B2 | 4/2018 | Nagami |
| 9,960,763 B2 | 5/2018 | Miller et al. |
| 9,972,503 B2 | 5/2018 | Tomura et al. |
| 9,997,374 B2 | 6/2018 | Takeda et al. |
| 10,020,800 B2 | 7/2018 | Prager et al. |
| 10,026,593 B2 | 7/2018 | Alt et al. |
| 10,027,314 B2 | 7/2018 | Prager et al. |
| 10,041,174 B2 | 8/2018 | Matsumoto et al. |
| 10,042,407 B2 | 8/2018 | Grede et al. |
| 10,063,062 B2 | 8/2018 | Voronin et al. |
| 10,074,518 B2 | 9/2018 | Van Zyl |
| 10,085,796 B2 | 10/2018 | Podany |
| 10,090,191 B2 | 10/2018 | Tomura et al. |
| 10,102,321 B2 | 10/2018 | Povolny et al. |
| 10,109,461 B2 | 10/2018 | Yamada et al. |
| 10,115,567 B2 | 10/2018 | Hirano et al. |
| 10,115,568 B2 | 10/2018 | Kellogg et al. |
| 10,176,970 B2 | 1/2019 | Nitschke |
| 10,176,971 B2 | 1/2019 | Nagami |
| 10,181,392 B2 | 1/2019 | Leypold et al. |
| 10,199,246 B2 | 2/2019 | Koizumi et al. |
| 10,217,618 B2 | 2/2019 | Larson et al. |
| 10,217,933 B2 | 2/2019 | Nishimura et al. |
| 10,224,822 B2 | 3/2019 | Miller et al. |
| 10,229,819 B2 | 3/2019 | Hirano et al. |
| 10,249,498 B2 | 4/2019 | Ventzek et al. |
| 10,268,846 B2 | 4/2019 | Miller et al. |
| 10,269,540 B1 | 4/2019 | Carter et al. |
| 10,276,420 B2 | 4/2019 | Ito et al. |
| 10,282,567 B2 | 5/2019 | Miller et al. |
| 10,283,321 B2 | 5/2019 | Yang et al. |
| 10,290,506 B2 | 5/2019 | Ranjan et al. |
| 10,297,431 B2 | 5/2019 | Zelechowski et al. |
| 10,304,661 B2 | 5/2019 | Ziemba et al. |
| 10,304,668 B2 | 5/2019 | Coppa et al. |
| 10,312,048 B2 | 6/2019 | Dorf et al. |
| 10,312,056 B2 | 6/2019 | Collins et al. |
| 10,320,373 B2 | 6/2019 | Prager et al. |
| 10,332,730 B2 | 6/2019 | Christie |
| 10,340,123 B2 | 7/2019 | Ohtake |
| 10,348,186 B2 | 7/2019 | Schuler et al. |
| 10,354,839 B2 | 7/2019 | Alt et al. |
| 10,373,755 B2 | 8/2019 | Prager et al. |
| 10,373,804 B2 | 8/2019 | Koh et al. |
| 10,373,811 B2 | 8/2019 | Christie et al. |
| 10,381,237 B2 | 8/2019 | Takeda et al. |
| 10,382,022 B2 | 8/2019 | Prager et al. |
| 10,387,166 B2 | 8/2019 | Preston et al. |
| 10,388,544 B2 | 8/2019 | Ui et al. |
| 10,389,345 B2 | 8/2019 | Ziemba et al. |
| 10,410,877 B2 | 9/2019 | Takashima et al. |
| 10,431,437 B2 | 10/2019 | Gapi 70nski et al. |
| 10,438,797 B2 | 10/2019 | Cottle et al. |
| 10,446,453 B2 | 10/2019 | Coppa et al. |
| 10,447,174 B1 | 10/2019 | Porter, Jr. et al. |
| 10,448,494 B1 | 10/2019 | Dorf et al. |

(56) References Cited

U.S. PATENT DOCUMENTS

| | | |
|---|---|---|
| 10,448,495 B1 | 10/2019 | Dorf et al. |
| 10,453,656 B2 | 10/2019 | Carducci et al. |
| 10,460,910 B2 | 10/2019 | Ziemba et al. |
| 10,460,911 B2 | 10/2019 | Ziemba et al. |
| 10,460,916 B2 | 10/2019 | Boyd, Jr. et al. |
| 10,483,089 B2 | 11/2019 | Ziemba et al. |
| 10,483,100 B2 | 11/2019 | Ishizaka et al. |
| 10,510,575 B2 | 12/2019 | Kraus et al. |
| 10,522,343 B2 | 12/2019 | Tapily et al. |
| 10,535,502 B2 | 1/2020 | Carducci et al. |
| 10,546,728 B2 | 1/2020 | Carducci et al. |
| 10,553,407 B2 | 2/2020 | Nagami et al. |
| 10,555,412 B2 | 2/2020 | Dorf et al. |
| 10,580,620 B2 | 3/2020 | Carducci et al. |
| 10,593,519 B2 | 3/2020 | Yamada et al. |
| 10,607,813 B2 | 3/2020 | Fairbairn et al. |
| 10,607,814 B2 | 3/2020 | Ziemba et al. |
| 10,658,189 B2 | 5/2020 | Hatazaki et al. |
| 10,659,019 B2 | 5/2020 | Slobodov et al. |
| 10,665,434 B2 | 5/2020 | Matsumoto et al. |
| 10,666,198 B2 | 5/2020 | Prager et al. |
| 10,672,589 B2 | 6/2020 | Koshimizu et al. |
| 10,672,596 B2 | 6/2020 | Brcka |
| 10,672,616 B2 | 6/2020 | Kubota |
| 10,685,807 B2 | 6/2020 | Dorf et al. |
| 10,707,053 B2 | 7/2020 | Urakawa et al. |
| 10,707,054 B1 | 7/2020 | Kubota |
| 10,707,055 B2 | 7/2020 | Shaw et al. |
| 10,707,086 B2 | 7/2020 | Yang et al. |
| 10,707,090 B2 | 7/2020 | Takayama et al. |
| 10,707,864 B2 | 7/2020 | Miller et al. |
| 10,714,372 B2 | 7/2020 | Chua et al. |
| 10,720,305 B2 | 7/2020 | Van Zyl |
| 10,734,906 B2 | 8/2020 | Miller et al. |
| 10,748,746 B2 | 8/2020 | Kaneko et al. |
| 10,755,894 B2 | 8/2020 | Hirano et al. |
| 10,763,150 B2 | 9/2020 | Lindley et al. |
| 10,773,282 B2 | 9/2020 | Coppa et al. |
| 10,774,423 B2 | 9/2020 | Janakiraman et al. |
| 10,777,388 B2 | 9/2020 | Ziemba et al. |
| 10,790,816 B2 | 9/2020 | Ziemba et al. |
| 10,791,617 B2 | 9/2020 | Dorf et al. |
| 10,796,887 B2 | 10/2020 | Prager et al. |
| 10,804,886 B2 | 10/2020 | Miller et al. |
| 10,811,227 B2 | 10/2020 | Van Zyl et al. |
| 10,811,228 B2 | 10/2020 | Van Zyl et al. |
| 10,811,229 B2 | 10/2020 | Van Zyl et al. |
| 10,811,230 B2 | 10/2020 | Ziemba et al. |
| 10,811,296 B2 | 10/2020 | Cho et al. |
| 10,847,346 B2 | 11/2020 | Ziemba et al. |
| 10,892,140 B2 | 1/2021 | Ziemba et al. |
| 10,892,141 B2 | 1/2021 | Ziemba et al. |
| 10,896,807 B2 | 1/2021 | Fairbairn et al. |
| 10,896,809 B2 | 1/2021 | Ziemba et al. |
| 10,903,047 B2 | 1/2021 | Ziemba et al. |
| 10,904,996 B2 | 1/2021 | Koh et al. |
| 10,916,408 B2 | 2/2021 | Dorf et al. |
| 10,923,320 B2 | 2/2021 | Koh et al. |
| 10,923,321 B2 | 2/2021 | Dorf et al. |
| 10,923,367 B2 | 2/2021 | Lubomirsky et al. |
| 10,923,379 B2 | 2/2021 | Liu et al. |
| 10,971,342 B2 | 4/2021 | Engelstaedter et al. |
| 10,978,274 B2 | 4/2021 | Kubota |
| 10,978,955 B2 | 4/2021 | Ziemba et al. |
| 10,985,740 B2 | 4/2021 | Prager et al. |
| 10,991,553 B2 | 4/2021 | Ziemba et al. |
| 10,991,554 B2 | 4/2021 | Zhao et al. |
| 10,998,169 B2 | 5/2021 | Ventzek et al. |
| 11,004,660 B2 | 5/2021 | Prager et al. |
| 11,011,349 B2 | 5/2021 | Brouk et al. |
| 11,075,058 B2 | 7/2021 | Ziemba et al. |
| 11,095,280 B2 | 8/2021 | Ziemba et al. |
| 11,101,108 B2 | 8/2021 | Slobodov et al. |
| 11,108,384 B2 | 8/2021 | Prager et al. |
| 2001/0003298 A1 | 6/2001 | Shamouilian et al. |
| 2001/0009139 A1 | 7/2001 | Shan et al. |
| 2001/0033755 A1 | 10/2001 | Ino et al. |
| 2002/0069971 A1 | 6/2002 | Kaji et al. |
| 2002/0078891 A1 | 6/2002 | Chu et al. |
| 2003/0026060 A1 | 2/2003 | Hiramatsu et al. |
| 2003/0029859 A1 | 2/2003 | Knoot et al. |
| 2003/0049558 A1 | 3/2003 | Aoki et al. |
| 2003/0052085 A1 | 3/2003 | Parsons |
| 2003/0079983 A1 | 5/2003 | Long et al. |
| 2003/0091355 A1 | 5/2003 | Jeschonek et al. |
| 2003/0137791 A1 | 7/2003 | Arnet et al. |
| 2003/0151372 A1 | 8/2003 | Tsuchiya et al. |
| 2003/0165044 A1 | 9/2003 | Yamamoto |
| 2003/0201069 A1 | 10/2003 | Johnson |
| 2004/0040665 A1 | 3/2004 | Mizuno et al. |
| 2004/0040931 A1 | 3/2004 | Koshiishi et al. |
| 2004/0066601 A1 | 4/2004 | Larsen |
| 2004/0112536 A1 | 6/2004 | Quon |
| 2004/0223284 A1 | 11/2004 | Iwami et al. |
| 2005/0022933 A1 | 2/2005 | Howard |
| 2005/0024809 A1 | 2/2005 | Kuchimachi |
| 2005/0039852 A1 | 2/2005 | Roche et al. |
| 2005/0092596 A1 | 5/2005 | Kouznetsov |
| 2005/0098118 A1 | 5/2005 | Amann et al. |
| 2005/0151544 A1 | 7/2005 | Mahoney et al. |
| 2005/0152159 A1 | 7/2005 | Isurin et al. |
| 2005/0286916 A1 | 12/2005 | Nakazato et al. |
| 2006/0075969 A1 | 4/2006 | Fischer |
| 2006/0130767 A1 | 6/2006 | Herchen |
| 2006/0139843 A1 | 6/2006 | Kim |
| 2006/0158823 A1 | 7/2006 | Mizuno et al. |
| 2006/0171848 A1 | 8/2006 | Roche et al. |
| 2006/0219178 A1 | 10/2006 | Asakura |
| 2006/0278521 A1 | 12/2006 | Stowell |
| 2007/0113787 A1 | 5/2007 | Higashiura et al. |
| 2007/0114981 A1 | 5/2007 | Vasquez et al. |
| 2007/0196977 A1 | 8/2007 | Wang et al. |
| 2007/0221331 A1 | 9/2007 | Lee |
| 2007/0284344 A1 | 12/2007 | Todorov et al. |
| 2007/0285869 A1 | 12/2007 | Howald |
| 2007/0297118 A1 | 12/2007 | Fujii |
| 2008/0012548 A1 | 1/2008 | Gerhardt et al. |
| 2008/0037196 A1 | 2/2008 | Yonekura et al. |
| 2008/0048498 A1 | 2/2008 | Wiedemuth et al. |
| 2008/0106842 A1 | 5/2008 | Ito et al. |
| 2008/0135401 A1 | 6/2008 | Kadlec et al. |
| 2008/0160212 A1 | 7/2008 | Koo et al. |
| 2008/0185537 A1 | 8/2008 | Walther et al. |
| 2008/0210545 A1 | 9/2008 | Kouznetsov |
| 2008/0236493 A1 | 10/2008 | Sakao |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2009/0059462 A1 | 3/2009 | Mizuno et al. |
| 2009/0078678 A1 | 3/2009 | Kojima et al. |
| 2009/0133839 A1 | 5/2009 | Yamazawa et al. |
| 2009/0236214 A1 | 9/2009 | Janakiraman et al. |
| 2009/0295295 A1 | 12/2009 | Shannon et al. |
| 2010/0018648 A1 | 1/2010 | Collins et al. |
| 2010/0025230 A1 | 2/2010 | Ehiasarian et al. |
| 2010/0029038 A1 | 2/2010 | Murakawa |
| 2010/0072172 A1 | 3/2010 | Ui et al. |
| 2010/0101935 A1 | 4/2010 | Chistyakov et al. |
| 2010/0118464 A1 | 5/2010 | Matsuyama |
| 2010/0154994 A1 | 6/2010 | Fischer et al. |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2010/0321047 A1 | 12/2010 | Zollner et al. |
| 2010/0326957 A1 | 12/2010 | Maeda et al. |
| 2011/0096461 A1 | 4/2011 | Yoshikawa et al. |
| 2011/0100807 A1 | 5/2011 | Matsubara et al. |
| 2011/0143537 A1 | 6/2011 | Lee et al. |
| 2011/0157760 A1 | 6/2011 | Willwerth et al. |
| 2011/0177669 A1 | 7/2011 | Lee et al. |
| 2011/0177694 A1 | 7/2011 | Chen et al. |
| 2011/0259851 A1 | 10/2011 | Brouk et al. |
| 2011/0281438 A1 | 11/2011 | Lee et al. |

(56) References Cited

U.S. PATENT DOCUMENTS

| | | |
|---|---|---|
| 2011/0298376 A1 | 12/2011 | Kanegae et al. |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0097908 A1 | 4/2012 | Willwerth et al. |
| 2012/0171390 A1 | 7/2012 | Nauman et al. |
| 2012/0319584 A1 | 12/2012 | Brouk et al. |
| 2013/0059448 A1 | 3/2013 | Marakhtanov et al. |
| 2013/0087447 A1 | 4/2013 | Bodke et al. |
| 2013/0175575 A1 | 7/2013 | Ziemba et al. |
| 2013/0213935 A1 | 8/2013 | Liao et al. |
| 2013/0214828 A1 | 8/2013 | Valcore, Jr. et al. |
| 2013/0220549 A1 | 8/2013 | Wilson |
| 2013/0340938 A1 | 12/2013 | Tappan et al. |
| 2013/0344702 A1 | 12/2013 | Nishizuka |
| 2014/0057447 A1 | 2/2014 | Yang et al. |
| 2014/0061156 A1 | 3/2014 | Brouk et al. |
| 2014/0062495 A1 | 3/2014 | Carter et al. |
| 2014/0077611 A1 | 3/2014 | Young et al. |
| 2014/0109886 A1 | 4/2014 | Singleton et al. |
| 2014/0117861 A1 | 5/2014 | Finley et al. |
| 2014/0125315 A1 | 5/2014 | Kirchmeier et al. |
| 2014/0154819 A1 | 6/2014 | Gaff et al. |
| 2014/0177123 A1 | 6/2014 | Thach et al. |
| 2014/0231389 A1 | 8/2014 | Nagami et al. |
| 2014/0238844 A1 | 8/2014 | Chistyakov |
| 2014/0262755 A1 | 9/2014 | Deshmukh et al. |
| 2014/0263182 A1 | 9/2014 | Chen et al. |
| 2014/0273487 A1 | 9/2014 | Deshmukh et al. |
| 2014/0305905 A1 | 10/2014 | Yamada et al. |
| 2014/0356984 A1 | 12/2014 | Ventzek et al. |
| 2014/0361690 A1 | 12/2014 | Yamada et al. |
| 2015/0002018 A1 | 1/2015 | Lill et al. |
| 2015/0043123 A1 | 2/2015 | Cox |
| 2015/0076112 A1 | 3/2015 | Sriraman et al. |
| 2015/0084509 A1 | 3/2015 | Yuzurihara et al. |
| 2015/0111394 A1 | 4/2015 | Hsu et al. |
| 2015/0116889 A1 | 4/2015 | Yamasaki et al. |
| 2015/0130354 A1 | 5/2015 | Leray et al. |
| 2015/0130525 A1 | 5/2015 | Miller et al. |
| 2015/0170952 A1 | 6/2015 | Subramani et al. |
| 2015/0181683 A1 | 6/2015 | Singh et al. |
| 2015/0235809 A1 | 8/2015 | Ito et al. |
| 2015/0256086 A1 | 9/2015 | Miller et al. |
| 2015/0303914 A1 | 10/2015 | Ziemba et al. |
| 2015/0315698 A1 | 11/2015 | Chistyakov |
| 2015/0318846 A1 | 11/2015 | Prager et al. |
| 2015/0325413 A1 | 11/2015 | Kim et al. |
| 2015/0366004 A1 | 12/2015 | Nangoy et al. |
| 2016/0004475 A1 | 1/2016 | Beniyama et al. |
| 2016/0020072 A1 | 1/2016 | Brouk et al. |
| 2016/0027678 A1 | 1/2016 | Parkhe et al. |
| 2016/0056017 A1 | 2/2016 | Kim et al. |
| 2016/0064189 A1 | 3/2016 | Tandou et al. |
| 2016/0196958 A1 | 7/2016 | Leray et al. |
| 2016/0241234 A1 | 8/2016 | Mavretic |
| 2016/0284514 A1 | 9/2016 | Hirano et al. |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2016/0351375 A1 | 12/2016 | Valcore, Jr. et al. |
| 2016/0358755 A1 | 12/2016 | Long et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0029937 A1 | 2/2017 | Chistyakov et al. |
| 2017/0069462 A1 | 3/2017 | Kanarik et al. |
| 2017/0076962 A1 | 3/2017 | Engelhardt |
| 2017/0098527 A1 | 4/2017 | Kawasaki et al. |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0162417 A1 | 6/2017 | Ye et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0221682 A1 | 8/2017 | Nishimura et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |
| 2017/0278665 A1 | 9/2017 | Carter et al. |
| 2017/0287791 A1 | 10/2017 | Coppa et al. |
| 2017/0311431 A1 | 10/2017 | Park |
| 2017/0316935 A1 | 11/2017 | Tan et al. |
| 2017/0330734 A1 | 11/2017 | Lee et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0076032 A1 | 3/2018 | Wang et al. |
| 2018/0102769 A1 | 4/2018 | Prager et al. |
| 2018/0139834 A1 | 5/2018 | Nagashima et al. |
| 2018/0166249 A1 | 6/2018 | Dorf et al. |
| 2018/0189524 A1 | 7/2018 | Miller et al. |
| 2018/0190501 A1 | 7/2018 | Ueda |
| 2018/0204708 A1 | 7/2018 | Tan et al. |
| 2018/0205369 A1 | 7/2018 | Prager et al. |
| 2018/0218905 A1 | 8/2018 | Park et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0309423 A1 | 10/2018 | Okunishi et al. |
| 2018/0331655 A1 | 11/2018 | Prager et al. |
| 2018/0350649 A1 | 12/2018 | Gomm |
| 2018/0366305 A1 | 12/2018 | Nagami et al. |
| 2018/0374672 A1 | 12/2018 | Hayashi et al. |
| 2019/0027344 A1 | 1/2019 | Okunishi et al. |
| 2019/0080884 A1 | 3/2019 | Ziemba et al. |
| 2019/0090338 A1 | 3/2019 | Koh et al. |
| 2019/0096633 A1 | 3/2019 | Pankratz et al. |
| 2019/0157041 A1 | 5/2019 | Zyl et al. |
| 2019/0157042 A1 | 5/2019 | Van Zyl et al. |
| 2019/0157044 A1 | 5/2019 | Ziemba et al. |
| 2019/0172685 A1 | 6/2019 | Van Zyl et al. |
| 2019/0172688 A1 | 6/2019 | Ueda |
| 2019/0180982 A1 | 6/2019 | Brouk et al. |
| 2019/0198333 A1 | 6/2019 | Tokashiki |
| 2019/0259562 A1 | 8/2019 | Dorf et al. |
| 2019/0267218 A1 | 8/2019 | Wang et al. |
| 2019/0277804 A1 | 9/2019 | Prager et al. |
| 2019/0295769 A1 | 9/2019 | Prager et al. |
| 2019/0295819 A1 | 9/2019 | Okunishi et al. |
| 2019/0318918 A1 | 10/2019 | Saitoh et al. |
| 2019/0333741 A1 | 10/2019 | Nagami et al. |
| 2019/0341232 A1 | 11/2019 | Thokachichu et al. |
| 2019/0348258 A1 | 11/2019 | Koh et al. |
| 2019/0348263 A1 | 11/2019 | Okunishi |
| 2019/0363388 A1 | 11/2019 | Esswein et al. |
| 2019/0385822 A1 | 12/2019 | Marakhtanov et al. |
| 2019/0393791 A1 | 12/2019 | Ziemba et al. |
| 2020/0016109 A1 | 1/2020 | Feng et al. |
| 2020/0020510 A1 | 1/2020 | Shoeb et al. |
| 2020/0024330 A1 | 1/2020 | Chan-Hui et al. |
| 2020/0035457 A1 | 1/2020 | Ziemba et al. |
| 2020/0035458 A1 | 1/2020 | Ziemba et al. |
| 2020/0035459 A1 | 1/2020 | Ziemba et al. |
| 2020/0036367 A1 | 1/2020 | Slobodov et al. |
| 2020/0037468 A1 | 1/2020 | Ziemba et al. |
| 2020/0051785 A1 | 2/2020 | Miller et al. |
| 2020/0051786 A1 | 2/2020 | Ziemba et al. |
| 2020/0058475 A1 | 2/2020 | Engelstaedter et al. |

(56) References Cited

U.S. PATENT DOCUMENTS

| | | | |
|---|---|---|---|
| 2020/0066497 A1 | 2/2020 | Engelstaedter et al. |
| 2020/0066498 A1 | 2/2020 | Engelstaedter et al. |
| 2020/0075293 A1 | 3/2020 | Ventzek et al. |
| 2020/0090905 A1 | 3/2020 | Brouk et al. |
| 2020/0106137 A1 | 4/2020 | Murphy et al. |
| 2020/0126760 A1 | 4/2020 | Ziemba et al. |
| 2020/0126837 A1 | 4/2020 | Kuno et al. |
| 2020/0144030 A1 | 5/2020 | Prager et al. |
| 2020/0161091 A1 | 5/2020 | Ziemba et al. |
| 2020/0161098 A1 | 5/2020 | Cui et al. |
| 2020/0161155 A1 | 5/2020 | Rogers et al. |
| 2020/0162061 A1 | 5/2020 | Prager et al. |
| 2020/0168436 A1 | 5/2020 | Ziemba et al. |
| 2020/0168437 A1 | 5/2020 | Ziemba et al. |
| 2020/0176221 A1 | 6/2020 | Prager et al. |
| 2020/0227230 A1 | 7/2020 | Ziemba et al. |
| 2020/0227289 A1 | 7/2020 | Song et al. |
| 2020/0234922 A1 | 7/2020 | Dorf et al. |
| 2020/0234923 A1 | 7/2020 | Dorf et al. |
| 2020/0243303 A1 | 7/2020 | Mishra et al. |
| 2020/0251371 A1 | 8/2020 | Kuno et al. |
| 2020/0266022 A1 | 8/2020 | Dorf et al. |
| 2020/0266035 A1 | 8/2020 | Nagaiwa |
| 2020/0294770 A1 | 9/2020 | Kubota |
| 2020/0328739 A1 | 10/2020 | Miller et al. |
| 2020/0352017 A1 | 11/2020 | Dorf et al. |
| 2020/0357607 A1 | 11/2020 | Ziemba et al. |
| 2020/0373114 A1 | 11/2020 | Prager et al. |
| 2020/0389126 A1 | 12/2020 | Prager et al. |
| 2020/0407840 A1 | 12/2020 | Hayashi et al. |
| 2020/0411286 A1 | 12/2020 | Koshimizu et al. |
| 2021/0005428 A1 | 1/2021 | Shaw et al. |
| 2021/0013006 A1 | 1/2021 | Nguyen et al. |
| 2021/0013011 A1 | 1/2021 | Prager et al. |
| 2021/0013874 A1 | 1/2021 | Miller et al. |
| 2021/0027990 A1 | 1/2021 | Ziemba et al. |
| 2021/0029815 A1 | 1/2021 | Bowman et al. |
| 2021/0043472 A1 | 2/2021 | Koshimizu et al. |
| 2021/0051792 A1 | 2/2021 | Dokan et al. |
| 2021/0066042 A1 | 3/2021 | Ziemba et al. |
| 2021/0082669 A1 | 3/2021 | Koshiishi et al. |
| 2021/0091759 A1 | 3/2021 | Prager et al. |
| 2021/0125812 A1 | 4/2021 | Ziemba et al. |
| 2021/0130955 A1 | 5/2021 | Nagaike et al. |
| 2021/0140044 A1 | 5/2021 | Nagaike et al. |
| 2021/0151295 A1 | 5/2021 | Ziemba et al. |
| 2021/0152163 A1 | 5/2021 | Miller et al. |
| 2021/0210313 A1 | 7/2021 | Ziemba et al. |
| 2021/0210315 A1 | 7/2021 | Ziemba et al. |
| 2021/0249227 A1 | 8/2021 | Bowman et al. |
| 2021/0272775 A1 | 9/2021 | Koshimizu |
| 2021/0288582 A1 | 9/2021 | Ziemba et al. |
| 2022/0406567 A1* | 12/2022 | Yang ............... H01J 37/32128 |

FOREIGN PATENT DOCUMENTS

| | | | |
|---|---|---|---|
| CN | 101707186 B | 2/2012 |
| CN | 105408993 A | 3/2016 |
| CN | 106206234 A | 12/2016 |
| CN | 104752134 B | 2/2017 |
| EP | 665306 A1 | 8/1995 |
| EP | 983394 A1 | 3/2000 |
| EP | 1119033 A1 | 7/2001 |
| EP | 1203441 A1 | 5/2002 |
| EP | 1214459 A1 | 6/2002 |
| EP | 1418670 A1 | 5/2004 |
| EP | 1691481 A1 | 8/2006 |
| EP | 1701376 A1 | 9/2006 |
| EP | 1708239 A1 | 10/2006 |
| EP | 1780777 A1 | 5/2007 |
| EP | 1852959 A1 | 11/2007 |
| EP | 2096679 A1 | 9/2009 |
| EP | 2221614 A1 | 8/2010 |
| EP | 2541584 A1 | 1/2013 |
| EP | 2580368 A1 | 4/2013 |
| EP | 2612544 A1 | 7/2013 |
| EP | 2838112 A1 | 2/2015 |
| EP | 2991103 A1 | 3/2016 |
| EP | 3086359 A1 | 10/2016 |
| EP | 3396700 A1 | 10/2018 |
| EP | 3616234 A1 | 3/2020 |
| JP | H08236602 A | 9/1996 |
| JP | 2748213 B2 | 5/1998 |
| JP | H11025894 A | 1/1999 |
| JP | 2002-313899 A | 10/2002 |
| JP | 2002299322 A | 10/2002 |
| JP | 2008501224 A | 1/2008 |
| JP | 4418424 B2 | 2/2010 |
| JP | 2011035266 A | 2/2011 |
| JP | 5018244 B2 | 9/2012 |
| JP | 2014112644 A | 6/2014 |
| JP | 2016-225439 A | 12/2016 |
| JP | 6741461 B2 | 8/2020 |
| KR | 100757347 B1 | 9/2007 |
| KR | 10-2007-0098556 A | 10/2007 |
| KR | 20160042429 A | 4/2016 |
| KR | 20200036947 A | 4/2020 |
| TW | 498706 B | 8/2002 |
| TW | 201717247 A | 5/2017 |
| WO | 1998053116 A1 | 11/1998 |
| WO | 2000017920 A1 | 3/2000 |
| WO | 2000030147 A1 | 5/2000 |
| WO | 2000063459 A1 | 10/2000 |
| WO | 2001005020 A1 | 1/2001 |
| WO | 2001012873 A1 | 2/2001 |
| WO | 2001013402 A1 | 2/2001 |
| WO | 2002052628 A1 | 7/2002 |
| WO | 2002054835 A2 | 7/2002 |
| WO | 2002059954 A1 | 8/2002 |
| WO | 2003037497 A2 | 5/2003 |
| WO | 2003052882 A2 | 6/2003 |
| WO | 2003054911 A2 | 7/2003 |
| WO | 2003077414 A2 | 9/2003 |
| WO | 2004084394 A1 | 9/2004 |
| WO | 2005124844 A1 | 12/2005 |
| WO | 2007118042 A2 | 10/2007 |
| WO | 2008016747 A2 | 2/2008 |
| WO | 2008050619 A1 | 5/2008 |
| WO | 2008061775 A1 | 5/2008 |
| WO | 2008061784 A1 | 5/2008 |
| WO | 2008062663 A1 | 5/2008 |
| WO | 2008121655 A1 | 10/2008 |
| WO | 2009012804 A1 | 1/2009 |
| WO | 2009069670 A1 | 6/2009 |
| WO | 2009111473 A2 | 9/2009 |
| WO | 2011073093 A1 | 6/2011 |
| WO | 2011087984 A2 | 7/2011 |
| WO | 2011156055 A1 | 12/2011 |
| WO | 2012030500 A1 | 3/2012 |
| WO | 2012109159 A1 | 8/2012 |
| WO | 2012122064 A1 | 9/2012 |
| WO | 2013000918 A1 | 1/2013 |
| WO | 2013016619 A1 | 1/2013 |
| WO | 2013084459 A1 | 6/2013 |
| WO | 2013088677 A1 | 6/2013 |
| WO | 2013099133 A1 | 7/2013 |
| WO | 2013114882 A1 | 8/2013 |
| WO | 2013118660 A1 | 8/2013 |
| WO | 2013125523 A1 | 8/2013 |
| WO | 2013187218 A1 | 12/2013 |
| WO | 2014035889 A1 | 3/2014 |
| WO | 2014035894 A1 | 3/2014 |
| WO | 2014035897 A1 | 3/2014 |
| WO | 2014036000 A1 | 3/2014 |
| WO | 2014124857 A2 | 8/2014 |
| WO | 2014197145 A1 | 12/2014 |
| WO | 2015060185 A1 | 4/2015 |
| WO | 2014124857 A3 | 5/2015 |
| WO | 2015134398 A1 | 9/2015 |
| WO | 2015198854 A1 | 12/2015 |
| WO | 2016002547 A1 | 1/2016 |
| WO | 2016059207 A1 | 4/2016 |
| WO | 2016060058 A1 | 4/2016 |
| WO | 2016060063 A1 | 4/2016 |

(56) References Cited

FOREIGN PATENT DOCUMENTS

| | | | |
|---|---|---|---|
| WO | 2015073921 | A8 | 5/2016 |
| WO | 2016104098 | A1 | 6/2016 |
| WO | 2016128384 | A1 | 8/2016 |
| WO | 2016131061 | A1 | 8/2016 |
| WO | 2016170989 | A1 | 10/2016 |
| WO | 2017172536 | A1 | 10/2017 |
| WO | 2017208807 | A1 | 12/2017 |
| WO | 2018048925 | A1 | 3/2018 |
| WO | 2018111751 | A1 | 6/2018 |
| WO | 2018170010 | A1 | 9/2018 |
| WO | 2018197702 | A1 | 11/2018 |
| WO | 2019036587 | A1 | 2/2019 |
| WO | 2019040949 | A1 | 2/2019 |
| WO | 2019099102 | A1 | 5/2019 |
| WO | 2019099870 | A1 | 5/2019 |
| WO | 2019185423 | A1 | 10/2019 |
| WO | 2019225184 | A1 | 11/2019 |
| WO | 2019239872 | A1 | 12/2019 |
| WO | 2019244697 | A1 | 12/2019 |
| WO | 2019244698 | A1 | 12/2019 |
| WO | 2019244734 | A1 | 12/2019 |
| WO | 2019245729 | A1 | 12/2019 |
| WO | 2020004048 | A1 | 1/2020 |
| WO | 2020017328 | A1 | 1/2020 |
| WO | 2020022318 | A1 | 1/2020 |
| WO | 2020022319 | A1 | 1/2020 |
| WO | 2020026802 | A1 | 2/2020 |
| WO | 2020036806 | A1 | 2/2020 |
| WO | 2020037331 | A1 | 2/2020 |
| WO | 2020046561 | A1 | 3/2020 |
| WO | 2020051064 | A1 | 3/2020 |
| WO | 2020112921 | A1 | 6/2020 |
| WO | 2020121819 | A1 | 6/2020 |
| WO | 2020145051 | A1 | 7/2020 |
| WO | 2021003319 | A1 | 1/2021 |
| WO | 2021062223 | A1 | 4/2021 |
| WO | 2021097459 | A1 | 5/2021 |
| WO | 2021134000 | A1 | 7/2021 |

OTHER PUBLICATIONS

Taiwan Office Action for Application No. 107125613 dated Dec. 24, 2020, 16 pages.

PCT International Search Report and Written Opinion dated Nov. 7, 2018, for International Application No. PCT/US2018/042965.

Eagle Harbor Technologies presentation by Dr. Kenneth E. Miller—"The EHT Integrated Power Module (IPM): An IGBT-Based, High Current, Ultra-Fast, Modular, Programmable Power Supply Unit," Jun. 2013, 21 pages.

Eagle Harbor Technologies webpage—"EHT Integrator Demonstration at DIII-D," 2015, 1 page.

Eagle Harbor Technologies webpage—"High Gain and Frequency Ultra-Stable Integrators for ICC and Long Pulse ITER Applications," 2012, 1 page.

Eagle Harbor Technologies webpage—High Gain and Frequency Ultra-Stable Integrators for Long Pulse and/or High Current Applications, 2018, 1 page.

Eagle Harbor Technologies webpage—"In Situ Testing of EHT Integrators on a Tokamak," 2015, 1 page.

Eagle Harbor Technologies webpage—"Long-Pulse Integrator Testing with DIII-D Magnetic Diagnostics," 2016, 1 page.

Kamada, Keiichi, et al., Editors—"New Developments of Plasma Science with Pulsed Power Technology," Research Report, NIFS-PROC-82, presented at National Institute for Fusion Science, Toki, Gifu, Japan, Mar. 5-6, 2009, 109 pages.

Prager, J.R., et al.—"A High Voltage Nanosecond Pulser with Variable Pulse Width and Pulse Repetition Frequency Control for Nonequilibrium Plasma Applications," IEEE 41st International Conference on Plasma Sciences (ICOPS) held with 2014 IEEE International Conference on High-Power Particle Beams (BEAMS), pp. 1-6, 2014.

Semiconductor Components Industries, LLC (SCILLC)—"Switch-Mode Power Supply" Reference Manual, SMPSRM/D, Rev. 4, Apr. 2014, ON Semiconductor, 73 pages.

Sunstone Circuits—"Eagle Harbor Tech Case Study," date unknown, 4 pages.

International Search Report and Written Opinion for PCT/US2019/052067 dated Jan. 21, 2020.

Electrical 4 U webpage—"Clamping Circuit," Aug. 29, 2018, 9 pages.

Kyung Chae Yang et al., A study on the etching characteristics of magnetic tunneling junction materials using DC pulse-biased inductively coupled plasmas, Japanese Journal of Applied Physics, vol. 54, 01AE01, Oct. 29, 2014, 6 pages.

PCT Notification of Transmittal of the International Search Report and the Written Opinion of the International Searching Authority for International Application No. PCT/US2019/048392; dated Dec. 16, 2019; 13 pages.

PCT International Search Report and Written Opinion dated Nov. 7, 2018, for International Application No. PCT/US2018/042961.

PCT International Search Report and Written Opinion dated Nov. 7, 2018, for International Application No. PCT/US2018/042956.

U.S. Appl. No. 62/433,204; entitled Creating Arbitrarily-Shaped Ion Energy Distribution Function (IEDF) Using Shaped-Pulse (EV) Bias; by Leonid Dorf, etal.; filed Dec. 16, 2016; 22 total pages.

U.S. Appl. No. 15/424,405; entitled System for Tunable Workpiece Biasing in a Plasma Reactor; by Travis Koh, et al.; filed Feb. 3, 2017; 29 total pages.

U.S. Appl. No. 15/618,082; entitled Systems and Methods for Controlling a Voltage Waveform at a Substrate During Plasma Processing; by Leonid Dorf, et al.; filed Jun. 8, 2017; 35 total pages.

PCT Notification of Transmittal of the International Search Report and the Written Opinion of the International Searching Authority for International Application No. PCT/US2018/046171; dated Nov. 28, 2018; 10 total pages.

PCT Notification of Transmittal of the International Search Report and the Written Opinion of the International Searching Authority for International Application No. PCT/US2018/046182; dated Nov. 30, 2018; 10 total pages.

Eagle Harbor Technologies presentation by Dr. Kenneth E. Miller—"The EHT Long Pulse Integrator Program," ITPA Diagnostic Meeting, General Atomics, Jun. 4-7, 2013, 18 pages.

Lin, Jianliang, et al.,—"Diamond like carbon films deposited by HiPIMS using oscillatory voltage pulses," Surface & Coatings Technology 258, 2014, published by Elsevier B.V., pp. 1212-1222.

PCT/US2020/014453 Interanational Search Report and Written Opinion dated May 14, 2020 consists of 8 pages.

S.B. Wang et al. "Ion Bombardment Energy and SiO 2/Si Fluorocarbon Plasma Etch Selectivity", Journal of Vacuum Science & Technology A 19, 2425 (2001).

Korean Office Action for 10-2020-7007495 dated Jun. 14, 2021.

Zhen-hua Bi et al., A brief review of dual-frequency capacitively coupled discharges, Current Applied Physics, vol. 11, Issue 5, Supplement, 2011, pp. S2-S8.

Chang, Bingdong, "Oblique angled plasma etching for 3D silicon structures with wiggling geometries" 31(8), [085301]. https://doi.org/10.1088/1361-6528/ab53fb. DTU Library. 2019.

Michael A. Lieberman, "A short course of the principles of plasma discharges and materials processing", Department of Electrical Engineering and Computer Sciences University of California, Berkeley, CA 94720.

Dr. Steve Sirard, "Introduction to Plasma Etching", Lam Research Corporation. 64 pages.

Zhuoxing Luo, B.S., M.S, "RF Plasma Etching With a DC Bias" A Dissertation in Physics. Dec. 1994.

Michael A. Lieberman, "Principles of Plasma Discharges and Material Processing", A Wiley Interscience Publication. 1994.

Yiting Zhang et al. "Investigation of feature orientation and consequences of ion tilting during plasma etching with a three-dimensional feature profile simulator", Nov. 22, 2016.

Richard Barnett et al. A New Plasma Source for Next Generation MEMS Deep Si Etching: Minimal Tilt, Improved Profile Uniformity and Higher Etch Rates, SPP Process Technology Systems. 2010.

(56) References Cited

OTHER PUBLICATIONS

The International Search Report and the Written Opinion for International Application No. PCT/US2021/040380; dated Oct. 27, 2021; 10 pages.
International Search Report and Written Opinion dated Feb. 4, 2022 for Application No. PCT/US2021/054806.
International Search Report and Written Opinion dated Feb. 4, 2022 for Application No. PCT/US2021/054814.
U.S. Appl. No. 17/346,103, filed Jun. 11, 2021.
U.S. Appl. No. 17/349,763, filed Jun. 16, 2021.
U.S. Appl. No. 63/242,410, filed Sep. 9, 2021.
U.S. Appl. No. 17/410,803, filed Aug. 24, 2021.
U.S. Appl. No. 17/537,107, filed Nov. 29, 2021.
U.S. Appl. No. 17/352,165, filed Jun. 18, 2021.
U.S. Appl. No. 17/352,176, filed Jun. 18, 2021.
U.S. Appl. No. 17/337,146, filed Jun. 2, 2021.
International Search Report and Written Opinion for PCT/US2022/024678 dated Aug. 5, 2022.

* cited by examiner

PLASMA EXCITATION WITH ION ENERGY CONTROL

BACKGROUND

Field

Embodiments of the present disclosure generally relate to a system used in semiconductor device manufacturing. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma-assisted etching process in which a plasma is formed in a processing chamber and ions from the plasma are accelerated towards a surface of a substrate to form openings in a material layer disposed beneath a mask layer formed on the surface of the substrate.

In a typical plasma-assisted etching process, the substrate is positioned on a substrate support disposed in a processing chamber, a plasma is formed over the substrate, and ions are accelerated from the plasma towards the substrate across a plasma sheath, i.e., region depleted of electrons, formed between the plasma and the surface of the substrate.

It has been found that conventional RF plasma-assisted etching processes, which only deliver sinusoidal waveform containing RF signals to one or more of the electrodes in a plasma processing chamber, do not adequately or desirably control the sheath properties and generated ion energies, which leads to undesirable plasma processing results. The undesirable processing results can include excessive sputtering of the mask layer and the generation of sidewall defects in high-aspect ratio features.

Accordingly, there is a need in the art for plasma processing and biasing methods that are able to provide desirable plasma-assisted etching process results.

SUMMARY

Embodiments provided herein generally include apparatus, plasma processing systems and methods for generation of a waveform for plasma processing of a substrate in a processing chamber.

One embodiment of the present disclosure is directed to a waveform generator for plasma processing. The waveform generator generally includes a voltage source selectively coupled to an output node, wherein the output node is configured to be coupled to an electrode disposed within a processing chamber, and wherein the output node is selectively coupled to a ground node, a radio frequency (RF) signal generator, and a first filter coupled between the RF signal generator and the output node.

One embodiment of the present disclosure is directed to a method for waveform generation. The method generally includes coupling a voltage source to an output node during a first phase of a waveform, wherein the output node is coupled to an electrode disposed within a processing chamber, and coupling a ground node to the output node during a second phase of the waveform, wherein a RF signal generator is coupled to the output node through a filter.

One embodiment of the present disclosure is directed to an apparatus for waveform generation. The apparatus generally includes a memory, and one or more processors coupled to the memory. The memory and the one or more processors are configured to: couple a voltage source to an output node during a first phase of a waveform, wherein the output node is coupled to an electrode disposed within a processing chamber; and couple a ground node to the output node during a second phase of the waveform, wherein a RF signal generator is coupled to the output node through a filter.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

DETAILED DESCRIPTION

With technology node advancing towards 2 nm, fabrication of smaller features with larger aspect ratios involve atomic precision for plasma processing. For etching processes where the plasma ions play an important role, ion energy control is challenging the semiconductor equipment industry. Traditionally RF biased techniques use a sinusoidal wave to excite plasma and accelerate ions.

Some embodiments of the present disclosure are generally directed to techniques for generating a waveform for controlling ion energy distribution (IED). For example, a pulsed voltage waveform and a radio frequency (RF) waveform may be applied to the same node in a plasma chamber to implement a low energy peak and a high-energy peak in the IED function with little to no intermediate energies between the low energy and high energy peaks, as described in more detail herein. Ions associated with the high-energy peak have the energy and directionality to reach to the bottom of a high-aspect ratio feature that is being etched and enable etching reactions. Although ions with low energy cannot reach the bottom of the feature during etching, the low energy ions are still important for etch processes. Ions with intermediate energies are not beneficial for etch processes as they do not have the desired directionality and will hit the sidewall of a feature being etched, often resulting in an undesired bowing of the sidewalls in the etched feature. Some embodiments are directed to techniques for generating a waveform having high energy and low energy peaks, with little to no intermediate energy ions.

Plasma Processing System Examples

Figure 1:
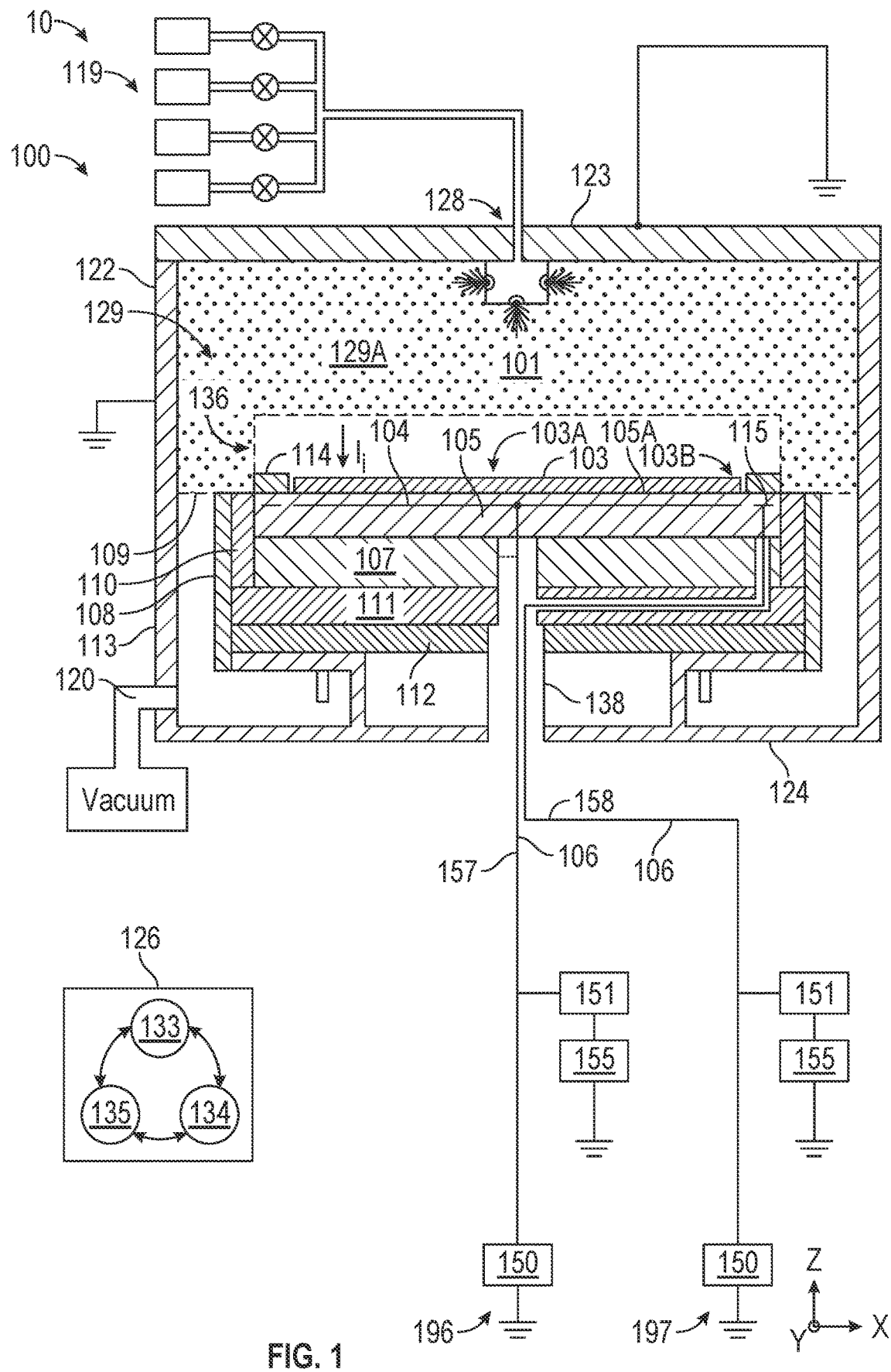
FIG. 1 is a schematic cross-sectional view of a processing system, according to one or more embodiments, configured to practice the methods set forth herein.

FIG. 1 is a schematic cross-sectional view of a processing system 10 configured to perform one or more of the plasma processing methods set forth herein. In some embodiments, the processing system 10 is configured for plasma-assisted etching processes, such as a reactive ion etch (RIE) plasma processing. However, it should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

As shown, the processing system 10 is configured to form a capacitively coupled plasma (CCP), where the processing chamber 100 include an upper electrode (e.g., chamber lid 123) disposed in a processing volume 129 facing a lower electrode (e.g., the substrate support assembly 136) also disposed in the processing volume 129. In a typical capacitively coupled plasma (CCP) processing system, a radio frequency (RF) source is electrically coupled to one of the upper or lower electrode delivers an RF signal configured to ignite and maintain a plasma (e.g., the plasma 101), which is capacitively coupled to each of the upper and lower electrodes and is disposed in a processing region therebetween. Typically, the opposing one of the upper or lower electrodes is coupled to ground or to a second RF power source for additional plasma excitation. As shown, the processing system 10 includes a processing chamber 100, a support assembly 136, and a system controller 126.

The processing chamber 100 typically includes a chamber body 113 that includes the chamber lid 123, one or more sidewalls 122, and a chamber base 124, which collectively define the processing volume 129. The one or more sidewalls 122 and chamber base 124 generally include materials that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy.

A gas inlet 128 disposed through the chamber lid 123 is used to deliver one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103.

In some embodiments, a plurality of lift pins 20 movably disposed through openings formed in the substrate support assembly 136 are used to facilitate substrate transfer to and from a substrate supporting surface 105A. In some embodiments, the plurality of lift pins 20 are disposed above and are coupled to and/or are engageable with a lift pin hoop (not shown) disposed in the processing volume 129. The lift pin hoop may be coupled to a shaft (not shown) that sealingly extends through the chamber base 124. The shaft may be coupled to an actuator (not shown) that is used to raise and lower the lift pin hoop. When the lift pin hoop is in a raised position, it engages with the plurality of lift pins 20 to raise the upper surfaces of the lift pins above the substrate supporting surface 105A, lifting the substrate 103 therefrom and enabling access to a non-active (backside) surface the substrate 103 by a robot handler (not shown). When the lift pin hoop is in a lowered position, the plurality of lift pins 20 are flush with or recessed below the substrate supporting surface 105A, and the substrate 103 rests thereon.

The system controller 126, also referred to herein as a processing chamber controller, includes a central processing unit (CPU) 133, a memory 134, and support circuits 135. The system controller 126 is used to control the process sequence used to process the substrate 103, including the substrate biasing methods described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing system 10.

Typically, the program, which is readable by CPU 133 in the system controller 126, includes code, which, when executed by the processor (CPU 133), performs tasks relating to the plasma processing schemes described herein. The program may include instructions that are used to control the various hardware and electrical components within the processing system 10 to perform the various process tasks and various process sequences used to implement the methods described herein. In one embodiment, the program includes instructions that are used to perform one or more of the operations described below in relation to FIG. 8.

The plasma control system generally includes a first source assembly 196 for establishing at least a first pulsed voltage (PV) waveform at a bias electrode 104, and a second source assembly 197 for establishing at least a second PV waveform at an edge control electrode 115. The first PV waveform or the second PV waveform may be generated using one or more components within a waveform generator assembly 150, which may correspond to a waveform generator as described in more detail herein with respect to FIGS. 4 and 5. In some embodiments, the waveform generator delivers an RF signal to the support base 107 (e.g., power electrode or cathode) or bias electrode 104 which may be used to generate (maintain and/or ignite) a plasma 101 in a processing region disposed between the substrate support assembly 136 and the chamber lid 123.

Figure 5:
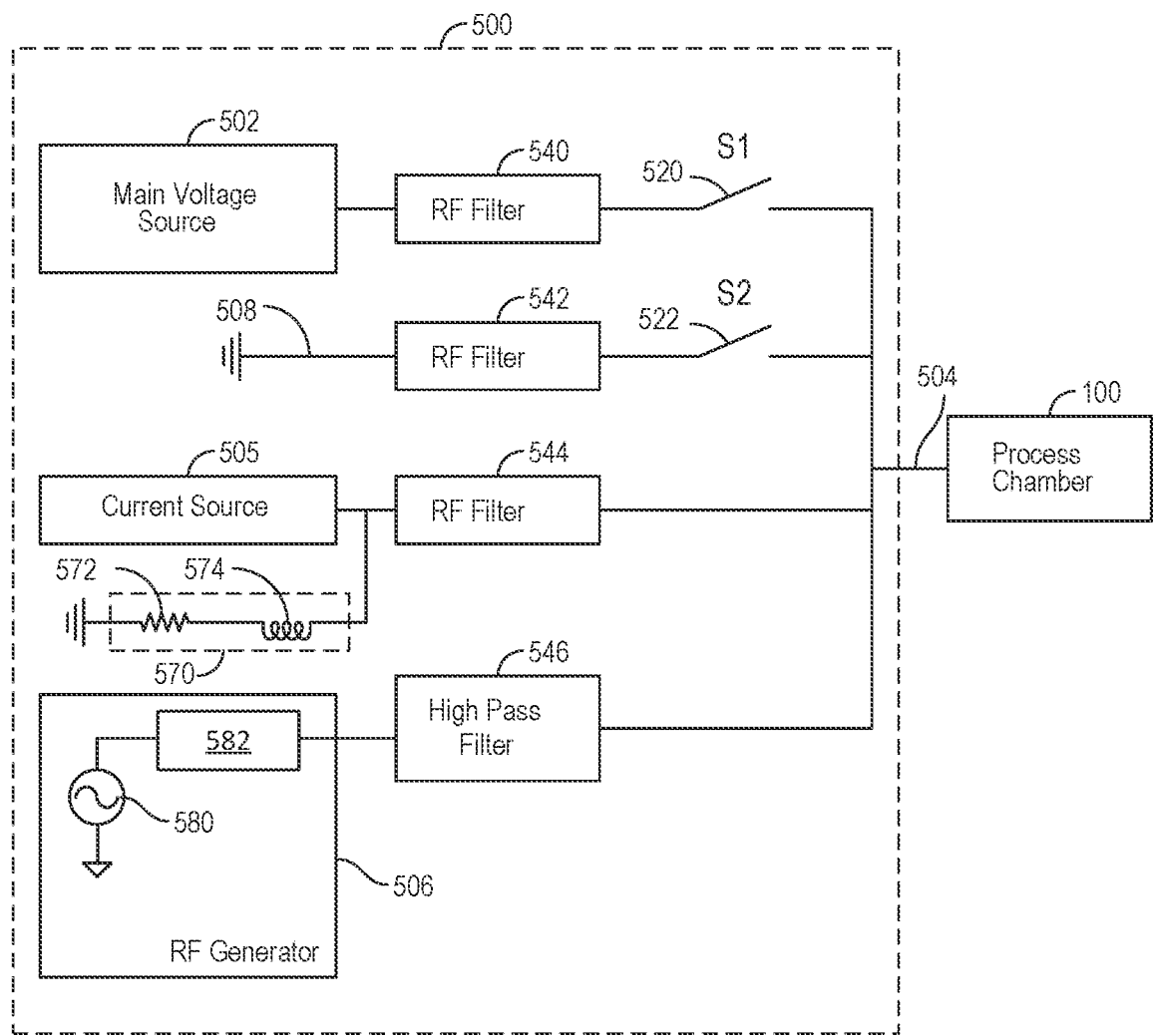
FIG. 5 illustrates an example implementation of a waveform generator for biasing a substrate to achieve IED control, in accordance with certain aspects of the present disclosure.

In some embodiments, the RF signal is used to ignite and maintain a processing plasma 101 using the processing gases disposed in the processing volume 129 and fields generated by the RF power (RF signal) delivered to the support base 107 and/or bias electrode 104. In some aspects, the RF signal may be generated by the waveform generator assembly 150. The processing volume 129 is fluidly coupled to one or more dedicated vacuum pumps through a vacuum outlet 120, which maintain the processing volume 129 at sub-atmospheric pressure conditions and evacuate processing and/or other gases, therefrom. In some embodiments, the substrate support assembly 136, disposed in the processing volume 129, is disposed on a support shaft 138 that is grounded and extends through the chamber base 124. The waveform generator assembly 150 may include an RF generator 506, as shown in FIG. 5. As shown in FIG. 5, the RF generator 506 may be implemented using an RF signal source 580 and a RF matching network 582, in some embodiments. In some embodiments, as discussed further below, the RF generator 506 is configured to deliver an RF signal having a frequency that is greater than 40 MHz, such as between about 40 MHz and about 200 MHz.

The substrate support assembly 136, as briefly discussed above, generally includes the substrate support 105 (e.g., ESC substrate support) and support base 107. In some embodiments, the substrate support assembly 136 can additionally include an insulator plate 111 and a ground plate 112, as is discussed further below. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing. In some embodiments, the support base 107 includes one or more cooling channels (not shown) disposed therein that are fluidly coupled to, and in fluid communication with, a coolant source (not shown), such as a refrigerant source or water source having a relatively high electrical resistance. In some embodiments, the substrate support 105 includes a heater (not shown), such as a resistive heating element embedded in the dielectric material thereof. Herein, the support base 107 is formed of a corrosion-resistant thermally conductive material, such as a corrosion-resistant metal, for example aluminum, an aluminum alloy, or a stainless steel and is coupled to the substrate support with an adhesive or by mechanical means.

Typically, the substrate support 105 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes the bias electrode 104 embedded in the dielectric material thereof.

In one configuration, the bias electrode 104 is a chucking pole used to secure (i.e., chuck) the substrate 103 to the substrate supporting surface 105A of the substrate support 105 and to bias the substrate 103 with respect to the processing plasma 101 using one or more of the pulsed-voltage biasing schemes described herein. Typically, the bias electrode 104 is formed of one or more electrically conductive parts, such as one or more metal meshes, foils, plates, or combinations thereof.

In some embodiments, the bias electrode 104 is electrically coupled to a clamping network, which provides a chucking voltage thereto, such as static DC voltage between about −5000 V and about 5000 V, using an electrical conductor, such as the coaxial power delivery line 106 (e.g., a coaxial cable). As will be discussed further below, the clamping network includes a DC power supply 155 (e.g., a high voltage DC (HVDC) supply) and a filter 151 (e.g., a low-pass filter).

The substrate support assembly 136 may further include the edge control electrode 115 that is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. In some embodiments, such as shown in FIG. 1, the edge control electrode 115 is positioned within a region of the substrate support 105. In some embodiments, as illustrated in FIG. 1, the edge control electrode 115 includes a conductive mesh, foil, and/or plate that is disposed a similar distance (i.e., Z-direction) from the substrate supporting surface 105A of the substrate support 105 as the bias electrode 104.

The edge control electrode 115 can be biased by use of a waveform generator assembly that is different from the waveform generator assembly 150 that is used to bias the bias electrode 104. In some embodiments, the edge control electrode 115 can be biased by use of a waveform generator assembly 150 that is also used to bias the bias electrode 104 by splitting part of the power to the edge control electrode 115. In one configuration, a first waveform generator assembly 150 of the first source assembly 196 is configured to bias the bias electrode 104, and a second waveform generator assembly 150 of a second source assembly 197 is configured to bias the edge control electrode 115.

A power delivery line 157 electrically connects the output of the waveform generator assembly 150 of the first source assembly 196 to the bias electrode 104. While the discussion below primarily discusses the power delivery line 157 of the first source assembly 196, which is used to couple a waveform generator assembly 150 to the bias electrode 104, the power delivery line 158 of the second source assembly 197, which couples a waveform generator assembly 150 to the edge control electrode 115, will include the same or similar components. The electrical conductor(s) within the various parts of the power delivery line 157 may include: (a) one or a combination of coaxial cables, such as a flexible coaxial cable that is connected in series with a rigid coaxial cable, (b) an insulated high-voltage corona-resistant hookup wire, (c) a bare wire, (d) a metal rod, (e) an electrical connector, or (f) any combination of electrical elements in (a)-(e).

In some embodiments, the processing chamber 100 further includes the quartz pipe 110, or collar, that at least partially circumscribes portions of the substrate support assembly 136 to prevent the substrate support 105 and/or the support base 107 from contact with corrosive processing gases or plasma, cleaning gases or plasma, or byproducts thereof. Typically, the quartz pipe 110, the insulator plate 111, and the ground plate 112 are circumscribed by a liner 108. In some embodiments, a plasma screen 109 is positioned between the cathode liner 108 and the sidewalls 122 to prevent plasma from forming in a volume underneath the plasma screen 109 between the liner 108 and the one or more sidewalls 122.

Figure 2A:
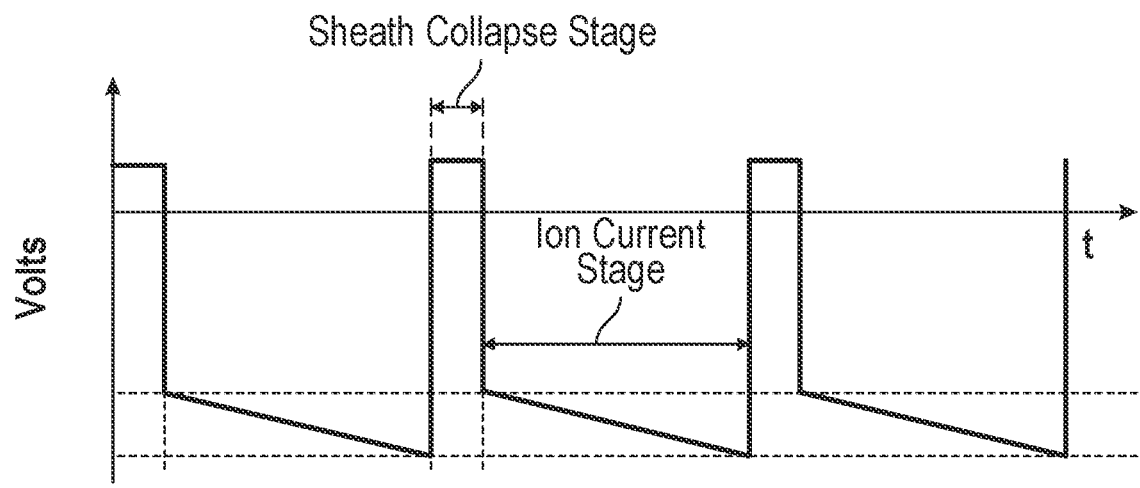
FIG. 2A shows a voltage waveform that may be applied to an electrode of a processing chamber, according to one or more embodiments.
Figure 2B:
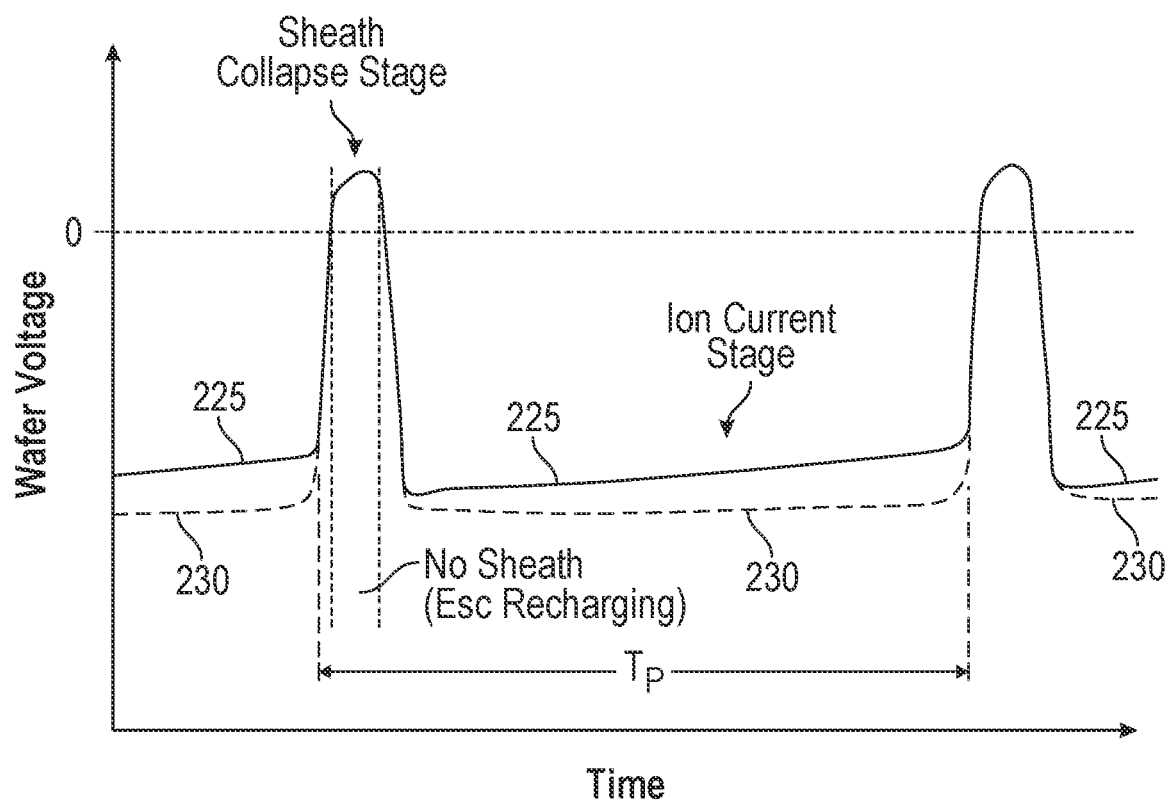
FIG. 2B shows a voltage waveform that is established on a substrate due to a voltage waveform applied to an electrode of a processing chamber.

FIG. 2A shows a voltage waveform that may be established at an electrode of a processing chamber. FIG. 2B illustrates an example of different types of voltage waveforms 225 and 230 established at a substrate due to different voltage waveforms, similar to the voltage waveform shown in FIG. 2A, that are separately established at an electrode within the processing chamber. The waveforms include two stages: an ion current stage and a sheath collapse stage, as shown. At the beginning of the ion current stage, a drop of substrate voltage creates a high voltage sheath above the substrate, accelerating positive ions to the substrate. The positive ions that bombard the surface of the substrate during the ion current stage deposit a positive charge on the substrate surface, which if uncompensated for causes a gradually increase the substrate voltage positively during the ion current stage, as illustrated by voltage waveform 225 in FIG. 2B. However, the uncontrolled accumulation of positive charge on the substrate surface undesirably gradually discharges the sheath and chuck capacitors, slowly decreasing the sheath voltage drop and bringing the substrate potential closer to zero, as illustrated by voltage waveform 225. The accumulation of positive charge results in the voltage droop in the voltage waveform established at the substrate (FIG. 2B). However, a voltage waveform that is established at the electrode that has a negative slope during the ion current stage, as shown in FIG. 2A, can be generated so as to establish a square shaped region (e.g., near zero slope) for an established substrate voltage waveform, as shown by curve 230 in FIG. 2B. Implementing the slope in the waveform established at the electrode during the ion current stage may be referred to as current compensation. The voltage difference between the beginning and end of the ion current phase determines an ion energy distribution function (IEDF) width. The greater the voltage difference, the wider the IEDF width. To achieve monoenergetic ions and a narrower IEDF width, operations are performed to flatten the substrate voltage waveform in the ion current phase using current compensation. In some embodiments of the present disclosure, a RF signal is overlaid on the voltage waveform shown in FIG. 2A.

Generation Technique for Waveform Generation

Certain embodiments of the present are generally directed to techniques for waveform generation that facilitate plasma processing of a substrate using simultaneous plasma generation and ion energy distribution (IED) control while reducing undesirable IED bowing profiles formed in the etched high aspect-ratio features. For example, a pulsed voltage (PV) waveform may be generated with an RF signal overlaid on the PV waveform. In some embodiments, the generated waveform may also include a ramp signal to facilitate current compensation, as described herein.

Figure 3A:
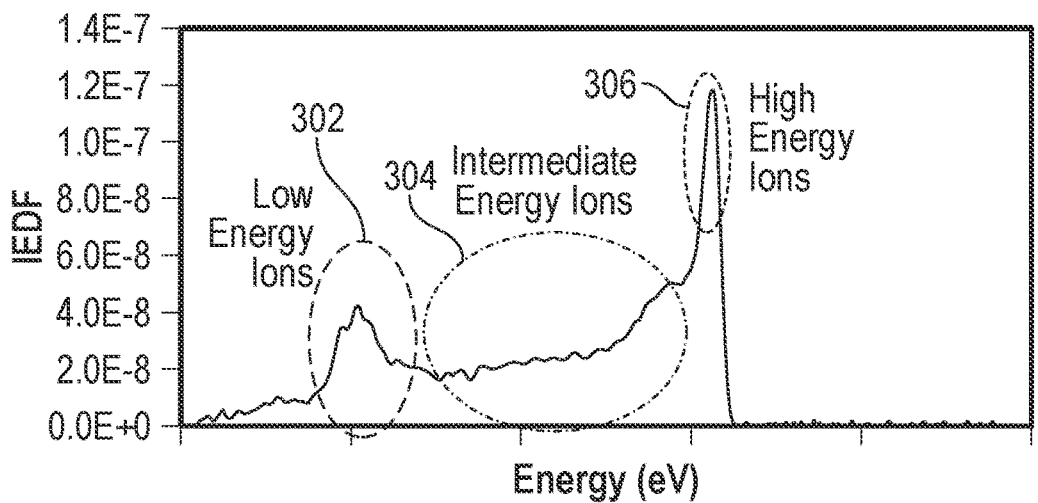
FIG. 3A illustrates a typical ion energy distribution (IED) when using a single frequency excitation waveform.

FIG. 3A illustrates a typical IED when using a single RF frequency excitation waveform. As shown, the IED has a bimodal shape having a high energy peak 306, a low energy peak 302, and intermediate energy ions (e.g., associated with an intermediate energy region 304). From the aspect of plasma etching processes, only the ions at or near the high energy peak have the energy and directionality to overcome the ion generated charging effect, created in the material that is being etched, and reach the bottom of a feature and enable etching reactions. Ions with intermediate energies are not beneficial for etch processes as they do not have the directionality and will tend to hit the sidewall of the feature, often resulting in an undesired IED bowing profile. Ions with low energy are important for etch processes as they clean the mask surface and maintain the shape of the mask layer, preventing hole clogging. Some embodiments of the present disclosure are directed to creating an energy profile having a high energy peak and a low energy peak, with little to no intermediate energy between the high and low energy peaks.

Figure 3B:
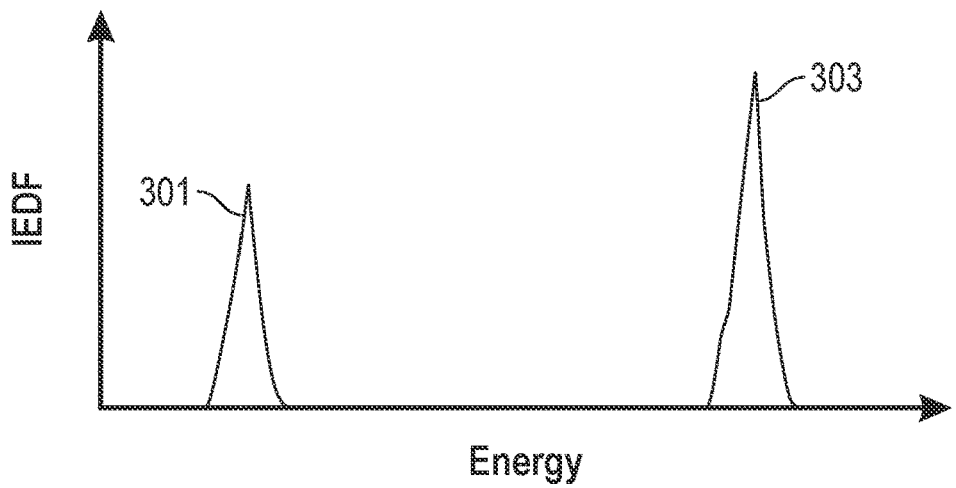
FIG. 3B is a graph illustrating an IED function (IEDF), in accordance with certain embodiments of the present disclosure.

FIG. 3B is a graph illustrating an IED function (IEDF), in accordance with certain embodiments of the present disclosure. As shown, the IEDF includes a low energy peak 301 and a high energy peak 303. The energy associated with the low energy peak may be less than a few hundred eVs (e.g., less 1K eV), and the energy associated with the high energy peak may be a few hundred eVs to tens of thousands eVs, depending on aspect ratio of the feature to be formed in substrate. For instance, in some cases, the energy associated with the high energy peak may be between 4 k eV to 10 k eV. As shown, no ions exist (or at least fewer than conventional implementations) between the low energy peak 301 and the high energy peak 303. Some embodiments are directed to techniques for implementing the ion energy distribution shown in FIG. 3B using a waveform tailoring technique, as described in more detail herein.

Figure 4:
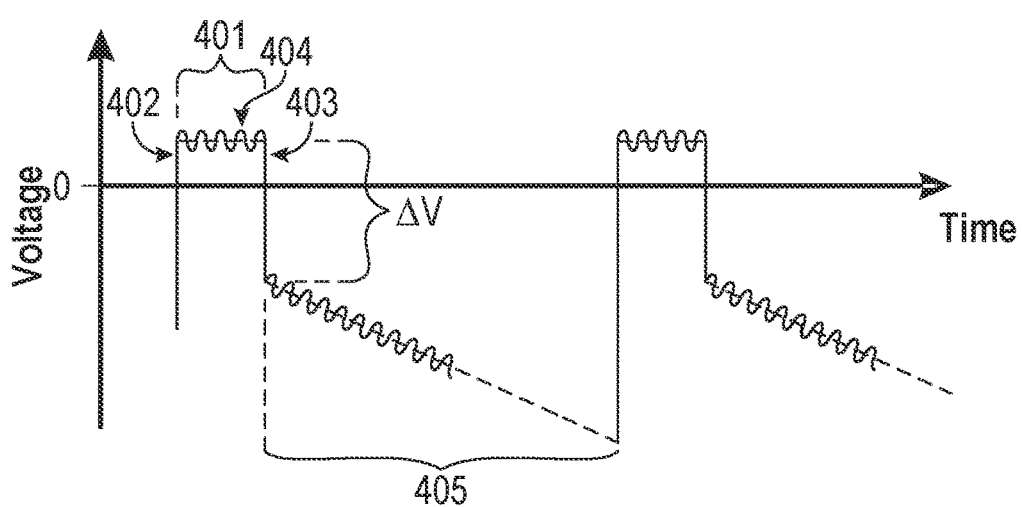
FIG. 4 illustrates a waveform generated using a waveform generator, in accordance with certain embodiments of the present disclosure.

FIG. 4 illustrates a waveform 400 generated using a waveform generator, in accordance with certain embodiments of the present disclosure. As shown, waveform 400 includes waveform regions 401 and 405. The waveform region 401 includes a direct current (DC) signal overlayed with a RF signal 404, and the waveform region 405 includes a voltage ramp (e.g., for current compensation) overlaid with the RF signal 404.

The RF signal 404 sustains the plasma in the chamber and produces the low energy peak 301 described with respect to FIG. 3B. The RF signal 404 may have a frequency between 40 MHz to 200 MHz, in some embodiments. The frequency of the RF signal 404 may be higher than the ion sheath transit frequency. In this case, the average ion transit time across the sheath thickness is longer than the period of the RF signal 404, resulting in the ions experiencing multiple cycles of RF signal 404 and obtaining the average energy associated with the multiple cycles to create the low energy peak 301. Therefore, ions are accelerated by the average sheath potential caused by the RF signal 404 such that a single ion energy peak is achieved. The high-frequency RF excitation produces ions with a mono energy peak. In other words, ions traveling across the sheath experience the average sheath potential driven by the RF signal 404, creating a single ion energy peak instead of a continuous energy distribution.

During a portion of a pulse waveform cycle, plasma bulk electrons are attracted to the surface of the substrate (e.g., substrate 103) due to the rising edge 402 of the pulse step. However, the plasma bulk electrons may be unable to establish a negative DC sheath potential to produce the higher energy peak 303. The substrate surface and the electrode (e.g., support base 107) form a capacitive element (e.g., referred to as an electrostatic chuck capacitor ($C_{esc}$)), which, in some embodiments, includes the dielectric material layer of the substrate support 105 disposed between the bias electrode 104 and the substrate supporting surface 105A, as shown in FIG. 1. There is an equal amount of positive charge on the electrode (e.g., as compared to the negative charge on the substrate) to cancel the field generated by the plasma bulk electrons. At the falling edge 403 of the waveform 400, the ions are neutralized by the electrons due to the application of the waveform to the electrode.

Therefore, a negative DC sheath potential is established on the substrate surface. This is the origin of the higher energy peak 303. The DC sheath potential (Vdc), or the higher ion energy can be approximated using the magnitude of the falling edge (ΔV) and the ratio between $C_{esc}$ and sheath capacitance ($C_{sheath}$) based on the equation:

$$Vdc = \frac{\Delta V \times Cesc}{Cesc + Csheath}$$

Thus, the waveform region 401 serves to sustain the plasma (e.g., while producing the lower energy peak 301) in the chamber and establish a DC sheath potential for the higher energy peak 303.

As incoming ions neutralize the electrons on the substrate surface, the DC sheath potential decreases if there is no means of compensation. Consequently, ions incident onto the substrate will not be monoenergetic. In some embodiments, a voltage ramp is implemented during waveform region 405 to supply an increasing amount of electrons to the electrode to cancel the otherwise increasing field caused by the positive charges due to the incoming ions, thereby maintaining constant sheath potential (mono-energy peak). A DC supply current for implementing the ramp may be controlled to equalize and compensate for the ion current provided during the ion current stage. The ion current ($I_{ion}$) can be calibrated by using ion energy diagnostics or calculated by sampling the electrode voltage (V0) (e.g., to calculate time derivative of V0) and the value of the sheath potential, based on equation:

$$I_{ion} = Csheath \frac{dV0}{dt}$$

As shown, the RF signal 404 may also be overlaid on the ramp signal during region 405 to continue sustaining the plasma (e.g., while producing the lower energy peak 301) in the chamber and establishing a DC sheath potential for the higher energy peak 303.

FIG. 5 illustrates an example implementation of a waveform generator 500 for biasing a substrate to achieve IED control, in accordance with certain embodiments of the present disclosure. The waveform generator 500 may be used to implement the waveform generator assembly 150, as described with respect to FIG. 1. As shown, the waveform generator 500 may generate the waveform 400 described with respect to FIG. 4.

The waveform generator 500 includes a main voltage source 502 (e.g., a DC voltage source) for implementing the positive voltage during waveform region 401, a current source 505 for implementing the ramp voltage during waveform region 405, and an RF generator 506 (also referred to as an RF signal generator) for providing the RF signal 404. The waveform generator 500 generates the waveform 400 at output node 504. The output node 504 may be coupled to the bias electrode 104 in the substrate support 105 (e.g., ceramic puck) or the support base 107. If the output node 504 is coupled to the support base 107, the total capacitance (e.g., $1/C_{total}=1/C_{esc}=1/C_{SB}$, where $C_{SB}$ is the capacitance of the dielectric layer disposed between the support base 107 and the bias electrode 104) between the output node 504 and the substrate 103 will be greater than if the output node 504 is coupled to the bias electrode 104 (e.g., $C_{esc}$). The greater capacitance may result in a lower voltage drop across $C_{esc}$ and more voltage drop on the sheath.

As shown, a switch 520 (e.g., a high voltage solid-state relay) may be coupled between the main voltage source 502 and the output node 504, and a switch 522 (e.g., a high voltage solid-state relay) may be coupled between a ground node 508 and the output node 504. As shown, RF filter 540 may be implemented in a path between the voltage source 502 and the switch 520, an RF filter 542 may be implemented in a path between the ground node 508 and switch 522, and an RF filter 544 may be implemented between the current source 505 and the output node 504. The RF filters 540, 542, 544 may be implemented as low-pass filters configured to block the RF signal(s) provided from the RF generator 506. The voltage source 502 and current source 505 are protected by respective RF filters 540, 544 from the output of the RF generator 506. In other words, the RF filters 540, 544 are configured to block the high-frequency RF signals provided from the RF generator 506. The ground node 508 is isolated from the RF generator 506 by the RF filter 542 (e.g., a low pass filter) when switch 522 is closed. In some embodiments, each of the RF filters 540, 542, 544 may be implemented as a parallel LC topology, as shown in FIG. 6.

Figure 6:
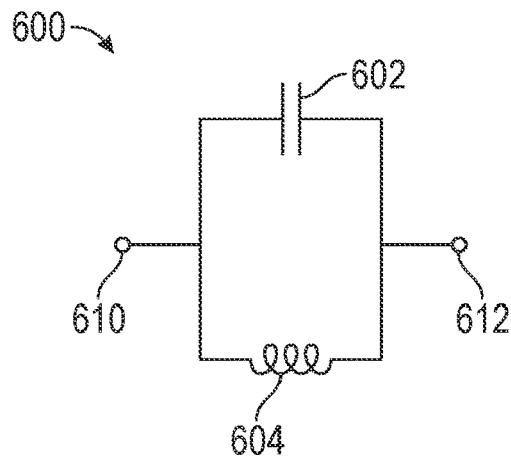
FIG. 6 illustrates an example filter topology, in accordance with certain embodiments of the present disclosure.

FIG. 6 illustrates a parallel LC filter topology 600 having a capacitive element 602 and an inductive element 604. As shown, the capacitive element 602 may be coupled in parallel to the inductive element 604 and between nodes 610, 612. Each of the RF filters 540, 542, 544 may be implemented using the parallel LC filter topology 600. For instance, for RF filter 542, the node 610 may be coupled to the ground node 508 and the node 612 may be coupled to switch 522. As one example, for a 40 MHz RF signal, the capacitive element 602 may be 100 pico-farads (pF) and the inductive element 604 may be 158 nano-henries (nH) to block the 40 MHz RF signal. In other words, the LC filter topology 600 is a resonant circuit that effectively acts as an open circuit for a 40 MHz signal, isolating the voltage source 502, ground node 508, or current source 505 from the 40 MHz RF signal.

Figure 7:
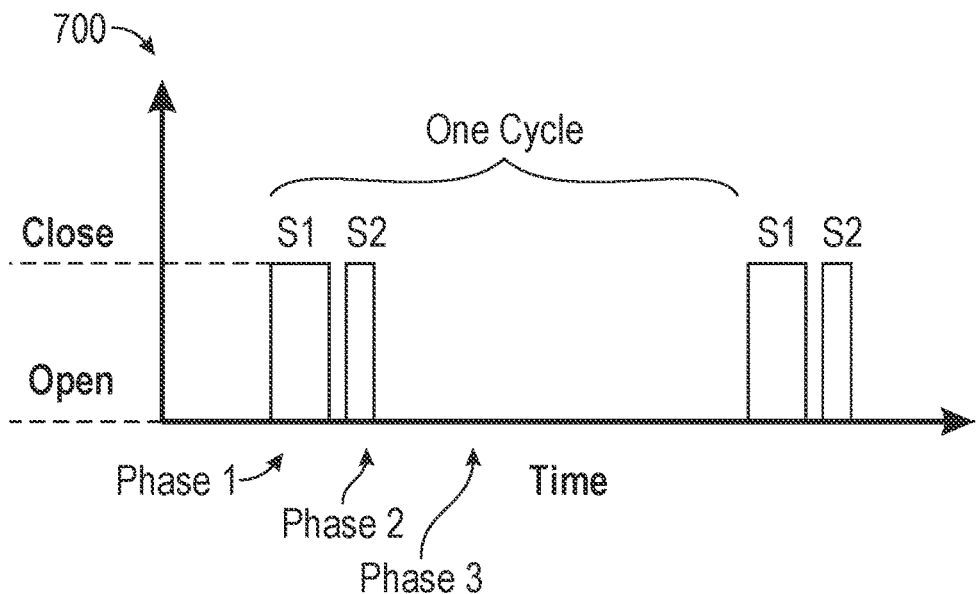
FIG. 7 is a timing diagram illustrating state of switches of the waveform generator of FIG. 5, in accordance with certain aspects of the present disclosure.

FIG. 7 is a timing diagram 700 illustrating states of switch 520 (labeled as "S1")" and switch 522 (labeled as "S2"), in accordance with certain embodiments of the present disclosure. As shown, switches 520, 522 are not closed simultaneously to avoid electrically shorting the voltage source 502 to the ground node 508. In some embodiments, during phase 1 of a waveform cycle (e.g., a cycle of waveform 400), switch 520 may be closed to produce the rising edge 402 as shown in FIG. 4. Switch 520 may be closed for a period ranging from 20 ns to 2000 ns to allow enough number of electrons to be collected at the substrate surface. After the period associated with waveform region 401, the switch 520 may be opened and switch 522 may be closed to produce the falling edge 403 during phase 2 of the waveform cycle. After opening the switch S1, switch S2 may be closed for a time period ranging from 10 ns to 100 ns.

In some embodiments, during phase 1 while switch S1 is closed, a positive charge accumulates on the substrate 103 shown in FIG. 1. The voltage on the substrate 103 cannot change instantaneously due to capacitive effects. Thus, during phase 2, once switch S1 is opened and switch S2 is closed, the voltage at the output node 504 (e.g., at electrode 104 shown in FIG. 1) drops from a positive voltage to a negative voltage as shown in FIG. 4. It is believed that the drop from the positive voltage to the negative voltage is due to a negative charge forming on the electrode 104 to counteract the positive charge on the substrate 104. In other words, the positive charge on the substrate 103 attracts electrons to the electrode 104, causing the drop to the negative voltage at the output node 504 upon closure of switch S2.

During phase 3 of the waveform cycle, both switches 520, 522 remain open. As shown in FIG. 5, RF generator 506 and the current source 505 may be connected to the output node 504 (e.g., to the chamber) at all times. In some embodiments, a high-pass filter 546 may be coupled between the RF generator 506 and the output node 504. The high-pass filter 546 isolates the RF generator from the DC components at the output node 504 (e.g., caused by the current source 505, voltage source 502 when switch 520 is closed, or the ground node 508 when switch 522 is closed). The high-pass filter 546 may be implemented as an alternating current (AC) blocking capacitor in some embodiments.

In some embodiments, an impedance 570 may be coupled between the output of the current source 505 and the ground node to shunt the output current from the current source 505 when the switch 520 closes. In other words, an abrupt impedance change may occur due to the coupling of the voltage source 502 to the output node 504. The impedance 570 provides a flow path for the current from the current source 505 to ground once the switch 520 closes, allowing a gradual decrease of the current from current source 505 after the rising edge 402. As shown, the impedance 570 may be implemented using an inductor-resistor (RL) circuit having an inductive element 574 and a resistive element 572. When using a 40 MHz RF signal, the impedance of the inductive element may be 2 microhenries (μH) and the resistance of the resistive element 572 may be 100 ohms.

The embodiments of the present disclosure provide a process-favorable dual-peak IED and a method to achieve such IED on substrate surface for plasma processing chambers with simultaneous plasma excitation and sustainment. One advantage of embodiments of the present disclosure as compared to traditional ion energy control techniques is the simultaneous plasma generation and IED control. After one PV waveform cycle has been completed, a plurality of additional PV waveform cycles will be serially repeated multiple times, as illustrated in FIG. 4 by the partial illustration of the repeated second voltage waveform cycle. In some embodiments, voltage waveform established at the electrode has an on-time, which is defined as the ratio of the ion current time period (e.g., length of waveform region 405) and the waveform period $T_P$ (e.g., length of waveform region 401+length of waveform region 405), is greater than 50%, or greater than 70%, such as between 80% and 95%. In some embodiments, a PV waveform that has a waveform cycle has a period $T_P$ of about 2.5 μs is serially repeated within a PV waveform burst that has a burst period that is between about 100 microseconds (μs) and about 10 milliseconds (ms). The burst of PV waveforms can have a burst duty cycle that is between about 5%-100%, such as between about 50% and about 95%, wherein the duty cycle is the ratio of the burst period divided by the burst period plus a non-burst period (i.e., no PV waveforms are generated) that separates the burst periods.

Figure 8:
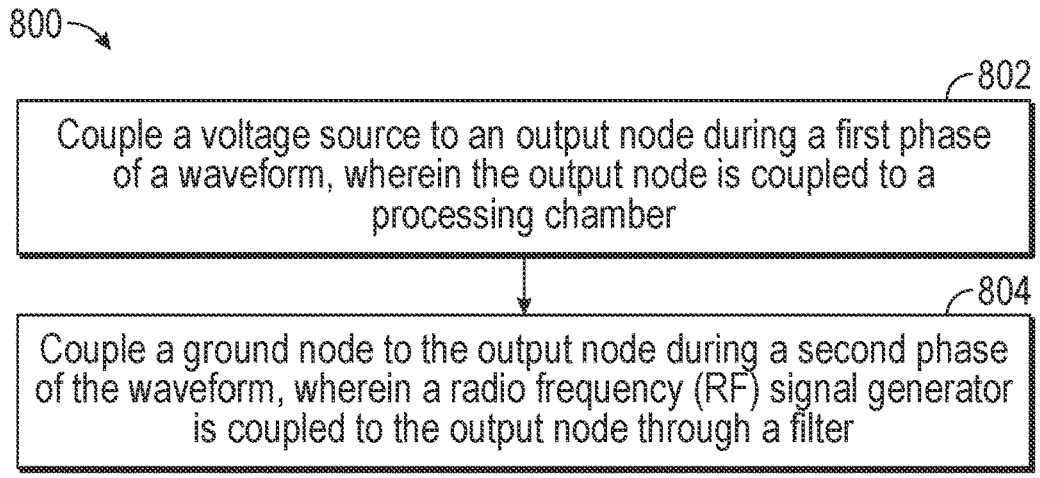
FIG. 8 is a process flow diagram illustrating a method for waveform generation.

FIG. 8 is a process flow diagram illustrating a method 800 for waveform generation. The method 800 may be performed by a waveform generation system including a waveform generator, such as the waveform generator 500, and/or a system controller such as the system controller 126.

At activity 802, the waveform generation system couples (e.g., by closing switch 520) a voltage source (e.g., voltage source 502) to an output node (e.g., output node 504) during a first phase (e.g., phase 1 shown in FIG. 7) of a waveform (e.g., waveform 400). The output node may be coupled to an electrode disposed within a processing chamber (e.g., processing chamber 100). For example, the output node may be coupled to electrode 104 or support base 107.

At activity 804, waveform generation system couples (e.g., by closing switch 522) a ground node (e.g., ground node 508) to the output node during a second phase (e.g., phase 2 shown in FIG. 7) of the waveform. In some embodiments, a RF signal generator (e.g., RF generator 506) is coupled to the output node through a filter (e.g., filter 546) during the first phase. The RF signal generator may be coupled to the output node during the first phase, the second phase, and a third phase (e.g., phase 3 shown in FIG. 7) of the waveform. The voltage source and the ground node are decoupled (e.g., by opening switches 520, 522) from the output node during the third phase. In some embodiments, the voltage source is coupled to the output node through a filter (e.g., filter 540), and the ground node is coupled to the output node through a filter (e.g., filter 542).

In some embodiments, a current source (e.g., current source 505) is coupled to the output node during a third phase of the waveform, the voltage source and the ground node being decoupled from the output node during the third phase. The current source may be coupled to the output node through a filter (e.g., filter 544).

The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A waveform generator for plasma processing, comprising:
   a voltage source selectively coupled to an output node, wherein
   the output node is configured to be coupled to an electrode disposed within a processing chamber, and
   the output node is selectively coupled to a ground node;
   a radio frequency (RF) signal generator; and
   a first filter coupled between the RF signal generator and the output node.

2. The waveform generator of claim 1, wherein the waveform generator is configured to generate a pulsed voltage signal by selectively coupling the voltage source and the ground node to the output node, and wherein the RF signal generator is configured to generate an RF signal overlaid on the pulsed voltage signal.

3. The waveform generator of claim 1, wherein the first filter comprises a high-pass filter.

4. The waveform generator of claim 1, wherein the voltage source is selectively coupled to the output node via a switch.

5. The waveform generator of claim 1, wherein the ground node is selectively coupled to the output node via a switch.

6. The waveform generator of claim 1, further comprising a second filter coupled between the voltage source and the output node.

7. The waveform generator of claim 1, further comprising a second filter coupled between the ground node and the output node.

8. The waveform generator of claim 7, wherein the second filter comprise a low-pass filter.

9. The waveform generator of claim 8, wherein the low-pass filter comprises a capacitive element in parallel with an inductive element.

10. The waveform generator of claim 1, further comprising:
a current source coupled to the output node; and
a second filter coupled between the current source and the output node.

11. The waveform generator of claim 10, further comprising:
a first switch configured to couple the voltage source to the output node during a first phase; and
a second switch configured to couple the ground node to the output node during a second phase, wherein the first switch and the second switch are further configured to decouple the voltage source and the ground node from the output node during a third phase, the RF signal generator being coupled to the output node during the third phase.

12. The waveform generator of claim 11, wherein the current source is coupled to the output node during the third phase.

13. The waveform generator of claim 11, wherein the RF signal generator is further coupled to the output node during the first phase and the second phase.

14. The waveform generator of claim 10, further comprising an impedance coupled between the current source and the ground node.

15. The waveform generator of claim 14, wherein the impedance comprises an inductive element and a resistive element.

16. The waveform generator of claim 1, wherein the voltage source comprises a direct current (DC) voltage source.

17. A method for waveform generation, comprising:
coupling a voltage source to an output node during a first phase of a waveform, wherein the output node is coupled to an electrode disposed within a processing chamber; and
coupling a ground node to the output node during a second phase of the waveform, wherein a radio frequency (RF) signal generator is coupled to the output node through a filter during the first phase.

18. The method of claim 17, further comprising:
generating a pulsed voltage signal at the output node by coupling the voltage source and the ground node to the output node; and
generating an RF signal overlaid on the pulsed voltage signal via the RF signal generator.

19. The method of claim 17, wherein the RF signal generator is coupled to the output node during the first phase, the second phase, and a third phase of the waveform, the voltage source and the ground node being decoupled from the output node during the third phase.

20. The method of claim 17, wherein the voltage source is coupled to the output node through a filter coupled between the voltage source and the output node.

21. The method of claim 17, wherein the ground node is coupled to the output node through a filter.

22. The method of claim 17, wherein a current source is coupled to the output node during a third phase of the waveform, the voltage source and the ground node being decoupled from the output node during the third phase.

23. The method of claim 22, wherein the current source is coupled to the output node through a filter.

24. The method of claim 22, wherein the RF signal is coupled to the output node through the filter during the second phase and the third phase.

25. An apparatus for waveform generation, comprising:
a memory; and
one or more processors coupled to the memory, the memory and the one or more processors being configured to:
couple a voltage source to an output node during a first phase of a waveform, wherein the output node is coupled to an electrode disposed within a processing chamber; and
couple a ground node to the output node during a second phase of the waveform, wherein a radio frequency (RF) signal generator is coupled to the output node through a filter during the first phase.

26. The apparatus of claim 25, wherein a current source is coupled to the output node during a third phase of the waveform, the voltage source and the ground node being decoupled from the output node during the third phase.

* * * * *